(12) United States Patent
Tanaka et al.

(10) Patent No.: US 7,897,962 B2
(45) Date of Patent: Mar. 1, 2011

(54) ORGANIC ELECTROLUMINESCENCE DEVICE, LIGHTING DEVICE, AND DISPLAY HAVING A REACTIVE ORGANIC COMPOUND

(75) Inventors: Tatsuo Tanaka, Sagamihara (JP); Hiroshi Kita, Hachioji (JP); Hideo Taka, Inagi (JP)

(73) Assignee: Konica Minolta Holdings, Inc. (JP)

( * ) Notice: Subject to any disclaimer, the term of this patent is extended or adjusted under 35 U.S.C. 154(b) by 205 days.

(21) Appl. No.: 12/294,814

(22) PCT Filed: Mar. 29, 2007

(86) PCT No.: PCT/JP2007/056848
§ 371 (c)(1),
(2), (4) Date: Sep. 26, 2008

(87) PCT Pub. No.: WO2007/114244
PCT Pub. Date: Oct. 11, 2007

(65) Prior Publication Data
US 2010/0108991 A1      May 6, 2010

(30) Foreign Application Priority Data

Mar. 30, 2006   (JP)   ............... 2006-093432
Mar. 31, 2006   (JP)   ............... 2006-097403
Mar. 31, 2006   (JP)   ............... 2006-097404

(51) Int. Cl.
*H01L 51/50*   (2006.01)
(52) U.S. Cl. .................. 257/40; 257/E51.027; 313/504
(58) Field of Classification Search .................. 257/40, 257/E51.027; 428/690; 313/504
See application file for complete search history.

(56) References Cited

U.S. PATENT DOCUMENTS 5,821,002 A       10/1998   Ohnishi et al.
2006/0081840 A1   4/2006    Mori et al.

FOREIGN PATENT DOCUMENTS

| EP | 0725120 A1 | 8/1996 |
| GB | 2419464 A | 4/2006 |
| JP | 09-045478 A | 2/1997 |
| JP | 2003-3272843 A | 9/2003 |
| JP | 2006-19678 A | 1/2006 |

OTHER PUBLICATIONS

International Search Report for International Application PCT/JP2007/056848; Date of mailing Jun. 19, 2007; with English translation.

*Primary Examiner*—Thomas L Dickey
(74) *Attorney, Agent, or Firm*—Cantor Colburn LLP

(57) ABSTRACT

Disclosed is an organic EL device exhibiting enhanced light-emitting efficiency and long-lived durability, and a lighting device and display device by use thereof.

20 Claims, 1 Drawing Sheet

US 7,897,962 B2

ORGANIC ELECTROLUMINESCENCE DEVICE, LIGHTING DEVICE, AND DISPLAY HAVING A REACTIVE ORGANIC COMPOUND

CROSS REFERENCE TO RELATED APPLICATIONS

This is a U.S. national stage of application No. PCT/JP2007/056848 filed on 29 Mar. 2007. Priority under 35 U.S.C. §119(a) and 35 U.S.C. §365(b) is claimed from Japanese Application No. 2006-093432 filed Mar. 30, 2006, Japanese Application No. 2006-097403 filed Mar. 31, 2006, and Japanese Application No. 2006-097404 filed Mar. 31, 2006 the disclosure of which is also incorporated herein by reference.

TECHNICAL FIELD

The present invention relates to an organic electroluminescence device, a lighting device and a display device.

TECHNICAL BACKGROUND

There have been known electroluminescence displays (ELD) as a light-emitting electronic display device. Constituent elements of the ELD include an inorganic electroluminescence device and an organic electroluminescence device (hereinafter, also denoted as an organic EL device). An inorganic electroluminescence device has been employed as a planar light source but requires a high alternating-current voltage to drive the luminescence device.

On the other hand, an organic EL device is composed of a luminescence layer containing a light-emitting compound between a cathode and an anode. Electrons and holes are injected into the luminescence layer and recombined to form excitons and light-emission is performed by employing luminescence (fluorescence/phosphorescence) emitted when the excitons are deactivated, so that emission is feasible at a voltage of from some volts (V) to tens of volts. Further, such an organic EL device is a self-emitting type and superior in viewing angle, exhibits high visibility and is a thin-layered complete solid device, so that it has been noted in terms of space-saving and portability.

There has been desired development of an organic EL device for a future practical use which efficiently emits a high luminescence at relatively low electric power consumption. For example, Japanese Patent No. 3093796 discloses a technique of a stilbene derivative, a distyrylarylene derivative or a tristyrylarylene derivative, doped with a slight amount of a phosphor, thereby achieving enhanced emission luminance and longer operating life of the device; Japanese Patent Application Publication (hereinafter, also denoted as JP-A) 63-264692 discloses a device having an organic luminescence layer comprised of 8-hydroxyquinoiline aluminum complex as a host compound and doped with a slight amount of a phosphor; and JP-A 3-255190 discloses a device having an organic luminescence layer comprised of 8-hydroxyquinoline aluminum complex as a host compound and doped with a quinacrydone dye.

In the foregoing techniques, when using luminescence from an excited singlet, the formation ratio of a singlet exciton to a triplet exciton being 1:3 results in the probability of forming light-emitting excited species is 25% and a light-extraction efficiency being approximately 20% leads to a limitation of external quantum efficiency ($\eta$ ext) being 5%.

However, after an organic EL device using phosphorescence emission from an excited triplet was reported by Princeton University [M. A. Baldo et al., Nature 395, 151-154 (1998)], studies of materials exhibiting phosphorescence at room temperature have become more active, as disclosed in M. A. Baldo et al., Nature 403 (17) 750-753 (1998) and U.S. Pat. No. 6,097,147.

Further, a recently found organic EL device employing phosphorescent luminescence enabled to realize approximately four times higher light-emitting efficiency than prior devices employing fluorescent luminescence, so that not only development of materials but also research and development of layer constitution and electrodes of light-emitting devices. For example, there have been studied syntheses of many compounds around heavy metal complexes such as iridium complexes, as disclosed in S. Lamansky et al., J. Am. Chem. Soc., 123, 4304 (2001).

An organic EL device is an all-solid device constituted of an organic material layer as thick as 0.1 µm or so between electrodes, and achieving light emission at a relatively low voltage so that it is expected as a technique used for a next generation planar display or illumination.

Such an organic EL device has a light-emitting mechanism based on a luminescence phenomenon employing quenching of from an excited state to the ground state of an organic material. Accordingly, to emit light in the short wavelength region of blue, bluish green and the like, the band gap needs to be broadened, requiring a higher voltage to achieve excitation through such a broadened band gap.

Further, since the excited state is located at a relatively high level, damage in returning to the ground state becomes larger and its life tends to be shortened, as compared to light emission of green or red. Specifically, phosphorescence emission employing light emission from a triplet excited state exhibits markedly such a tendency.

There are various techniques to overcome the problems described above. Examples thereof include a technique of forming a constituent layer of an organic electroluminescence device, followed by its polymerization, in which bi-functional triphenylamine derivatives having two vinyl groups in the molecule are described and such compounds are used to form a layer, followed by exposure to ultraviolet rays to form a three-dimensionally cured polymer (as disclosed in, for example, patent document 1); a technique of adding a material having at least two vinyl groups to plural layers, in which a polymerization reaction is performed by exposure to ultraviolet rays or heat at the time when forming an organic layer, prior to superposing a cathode (as disclosed in, for example, patent document 2); a production method in which a radical generating agent of AIBN (azobisisobutyronitrile) is added to a mixture of a material containing a vinyl group at the end of a phosphorescence dopant and a co-monomer containing a vinyl group and polymerization is allowed to proceed during layer formation (as disclosed in, for example, patent document 3); and a production method in which a Diels-Alder reaction is caused between two molecules within the same layer to perform curing (as disclosed in, for example, patent document 4).

Any one of the foregoing techniques is a method of completing a polymerization reaction during layer formation or immediately after forming a layer (or before attachment of a cathode) but is insufficient from a practical point of view of enhancement of durability of an organic EL device, and therefore, a technique for further enhanced durability of the device is desired.

Patent document 1: JP-A 5-27 Patent document 2: JP-A 2001-29 Patent document 3: JP-A 2003-7 Patent document 4: JP-A 2003-8

DISCLOSURE OF THE INVENTION

Problem to be Solved

The present invention has come into being in view of the foregoing problems and it is an object of the invention to provide an organic EL device exhibiting enhanced light emitting efficiency and a long-lived durability, a lighting device and a display device.

Means for Dissolving the Problem

The object of the invention was realized by the following constitution.

1. An organic electroluminescence device comprising on a support substrate an anode and a cathode, and one or more organic layers between the anode and the cathode and at least one organic layer containing a reactive organic compound, wherein when an electric current is applied to device at a current density of from 0.01 mA/cm$^2$ to 10000 mA/cm$^2$, a concentration of the reactive organic compound is reduced from a concentration before application of the electric current 2. The organic electroluminescence device as claimed in 1, wherein the current density is from 0.01 mA/cm$^2$ to 1000 mA/cm$^2$.

3. The organic electroluminescence device as claimed in claim 1 or 2, wherein the reactive organic compound is a polymerizable monomer.

4. The organic electroluminescence device as claimed in any one of claims 1 to 3, wherein the reactive organic compound contains plural reactive substituents.

5. The organic electroluminescence device as claimed in any one of claims 1 to 4, wherein a cross-linkage structure is formed upon reaction of the reactive organic compound.

6. The organic electroluminescence device as claimed in claim 4 or 5, wherein the reactive substituents each have any one of partial structures represented by the following formulas:

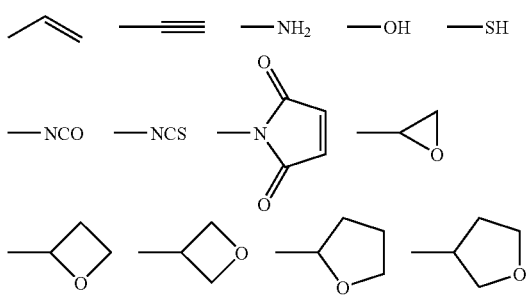

7. The organic electroluminescence device as claimed in any one of claims 1 to 6, wherein at least one of the organic layers contains a phosphorescent compound.

8. The organic electroluminescence device as claimed in any one of claims 1 to 7, wherein when an emission luminance is reduced to 90% of an initial emission luminance by application of the electric current, the concentration of the reactive organic compound in the organic layer is reduced from a concentration before the application of an electric current.

9. The organic electroluminescence device as claimed in any one of claims 1 to 8, wherein when an emission luminance is reduced to 90% of an initial luminance by application of the electric current, a concentration (M90) of the reactive organic compound is within a range of 0.1 mol/m$^3$ to 10 mol/m$^3$.

10. The organic electroluminescence device as claimed in any one of claims 1 to 9, wherein a ratio of a concentration (M70) of the reactive organic compound when an emission luminance is reduced to 70% of an initial luminance to a concentration (M90) of the reactive organic compound when a luminance is lowered to 90% of an initial luminance, ΔM (M70/M90) meets the following requirement (1):

$$0.1 \leq \Delta M < 1.0. \quad \text{requirement (1)}$$

11. The organic electroluminescence device as claimed in any one of claims 1 to 10, wherein at least one of the organic layers satisfies the following relational expression (1):

$$1.03 \leq [Tg(90\%)/Tg(\text{initial})] \leq 1.20 \quad \text{expression (1)}$$

wherein Tg(90%) is a glass transition point when an emission luminance is reduced to 90% of an initial emission luminance and Tg(initial) is a glass transition point before initiating the application of an electric current.

12. The organic electroluminescence device as claimed in any one of claims 1 to 11, wherein at least one of the organic layers satisfies the following relational expression (2):

$$1.04 \leq [Tg(90\%)/Tg(\text{initial})] \leq 1.20 \quad \text{expression (2)}$$

wherein Tg(50%) is a glass transition point when an emission luminance is reduced to 50% of an initial emission luminance and Tg(initial) is a glass transition point before initiating the application of an electric current.

13. The organic electroluminescence device as claimed in claim 12, wherein the Tg(90%) and the Tg(50%) meet the following relational expression (3):

$$1.00 < [Tg(50\%)/Tg(90\%)] \leq 1.05. \quad \text{expression (3)}$$

14. A lighting device provided with an organic electroluminescence device as claimed in any one of claims 1 to 13.

15. A display device provided with an organic electroluminescence device as claimed in any one of claims 1 to 13.

Eeffect of the Invention

According to the present invention, there was provided an organic EL device exhibiting enhanced light-emitting efficiency and a long-lived durability, a lighting device and a display device.

DESCRIPTION OF NUMERALS

Figure 1:
FIG. 1(a) illustrates constitution of an organic EL full-color display device.
FIG. 1(b) illustrates constitution of an organic EL full-color display device.
FIG. 1(c) illustrates constitution of an organic EL full-color display device.
FIG. 1(d) illustrates constitution of an organic EL full-color display device.
FIG. 1(e) illustrates constitution of an organic EL full-color display device.
Figure 1:
Figure 1:
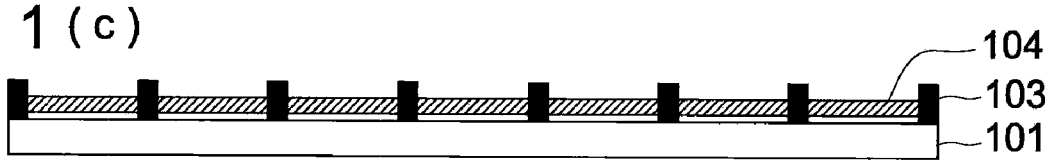
Figure 1:
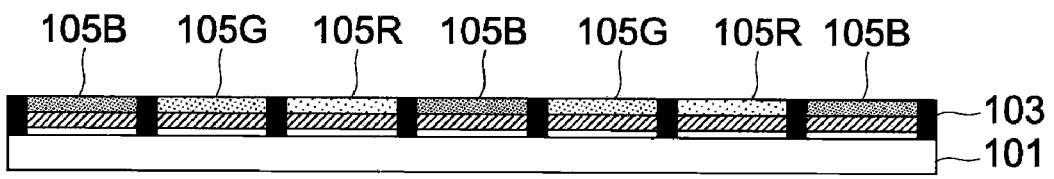
Figure 1:
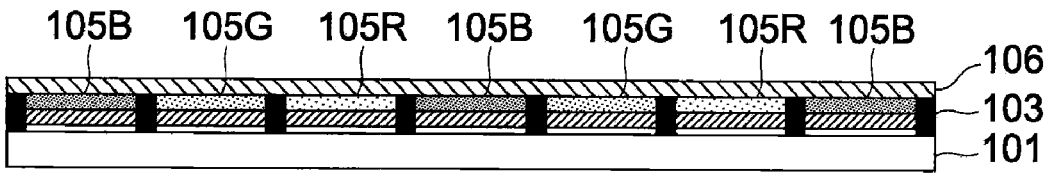

101: Glass substrate
102: ITO transparent electrode

103: Partition
104: Hole injection layer
105B, 105G, 105R: Light-emitting layers

PREFERRED EMBODIMENTS OF THE INVENTION

In the organic electroluminescence device (also denoted as organic EL device), an organic EL device exhibiting enhanced light emission efficiency and a long-lived durability was realized by providing a constitution described in any one of claims 1 to 7. There were also successfully obtained a display device and a lighting device of high luminance which were each provided with the foregoing organic EL device.

There will be successively detailed constitutions relating to the invention.

Organic Layer Containing Reactive Organic Compound

There will now be described an organic layer containing a reactive organic compound, relating to the invention.

The organic EL device of the invention has at least one organic layer containing a reactive organic compound. The device may also have other organic layers as a constituent layer. Preparation of the organic layer, which will be detailed later, may employ well-known coating methods or a method such as vapor deposition, or the constituent layer may be formed by a mixed means of a coating method and a vapor deposition method.

The inventors of this application made the discovery described below in the course of studying problems of conventionally known organic EL devices.

Exemplifying a process of forming an organic layer by coating, there will be described how the invention has come into being.

In the course of the inventor's experiments of repeating hardening and coating in the coating process, devices in which a reactive organic compound (also called an unreacted monomer or a compound containing a reactive substituent) was intentionally left (or allowed to remain) in the coated layer, was prepared and studied with respect to relationship between remaining in the compound and performance of the device.

As a result, it was found that a reactive organic compound remaining in the organic layer caused a decrease in concentration upon application of an electric current thereto, thereby enabling to control performance of the device in the direction intended by the inventors.

Specifically, for example, in cases of a reactive organic compound being an unreacted polymerizable monomer, it was proved that polymerization reaction proceeded by active radicals or the like generated in the course of using the device, forming a network polymer by organic molecules and enabling to achieving effective inhibition of deterioration of the device by controlling the Tg (glass transition point) of the constituent layer.

It was also proved that controlling the reaction accompanying cleavage or formation of a molecular conjugated system by using active radicals generated in the course of using a device made it feasible to change the luminescence wavelength of an organic EL device or inhibit deterioration at a specified wavelength.

With respect to reactive organic compounds relating to the invention, all of the functional compounds contained in constituent layers (described later) of an organic EL device are applicable as a mother nucleus. Examples of usable compounds include a host compound contained in a light-emitting layer, a luminescence dopant or the like, and a compound having a mother nucleus composed of a hole transport material, an electron transport material or the like, and the mother nucleus being substituted by a reactive substituent.

The reactive substituent preferably includes a partial structure represented below:

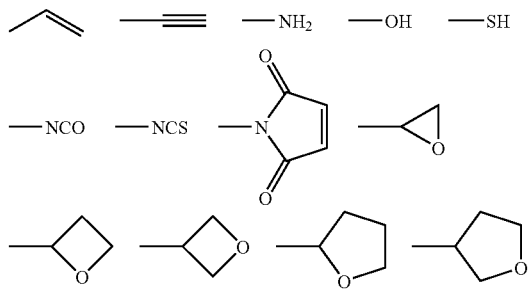

Further, in the manufacturing side, for example, in the case of a lamination process of coating, a lower layer is preferably insoluble in an upper layer and coating of the upper layer becomes feasible by polymerizing the lower layer, enabling coating of the upper layer. The prior art resulted in complete polymerization of the lower layer. On the contrary, this invention effected marked enhancement in function of the device by allowing a reactive organic compound to remain in the lower layer. Such an effect was unexpected and in addition to an enhanced function of the device, allowing the reactive organic compound to remain was also preferable, so that there was also proved a benefit in which the production process was simplified compared to the conventional production process.

Reduction of Reactive Organic Compound Concentration

One feature of the organic EL device of this invention is that in at least one organic layer containing a reactive organic compound (also denoted as an organic compound layer), initiation of electrically energizing the organic EL device results in reduction of a reactive organic compound concentration. The expression, reduction of a reactive organic compound concentration represents that a reaction (such as a cross-linking reaction, a polymerization reaction or the like) proceeds by applying an electric current to the device, whereby the concentration of the reactive organic compound is reduced.

Means for Analysis of Reduction of Concentration

Hereinafter, there will be described means for analysis of reduction of the concentration of a reactive organic compound in an organic layer.

Means for analysis of concentration of a reactive organic compound in an organic layer include analysis in the depth direction of the organic layer containing the reactive organic compound, thereby enabling to analyze concentration reduction due to application of an electric current.

With respect to, for example, a vinyl group-having monomer as a reactive organic compound, the distribution of a double-bonded vinyl group in the depth direction of an organic layer is measured by the following analyzing means to determine the concentration distribution within the layer.

First, it is necessary to secure an analysis area to such an extent that it is possible to perform analysis by a conventional technique for micro-area analysis. Therefore, obliquely cutting a thin layer is an effective means. Such oblique-cutting results in an area increased by $1/\cos\theta$ (in which $\theta$ is the value of a surface normal minus the angle of the cutting surface), compared to a section perpendicular to the surface.

Examples thereof include a cutting method by use of a conventional ultra-microtome with declining a cutter blade and a method of making a obliquely cut surface by using SAICAS type NN04, produced by DAIPLA WINTES CO., LTD.

After securing an analysis area, the double bond distribution is measured. There are cited some techniques for measurement of the double bond distribution. Preferred examples of an analysis technique include an infrared microspectrophotometry, Raman spectrophotometry and a method in which double bonds are labeled with a labeling agent capable of reacting specifically with a double-bond and containing a specific element and the distribution of labeled elements is measured by an electron beam probe micro-analyzer, an X-ray photoelectron spectrometer, an Auger electron spectrometer or a time-of-flight secondary ion mass spectrometer.

Specific analysis examples of reduction of the concentration of a reactive organic compound in the organic layer upon electrically energizing an organic EL device will be detailed in Examples described later.

Organic Reactive Compound

Of reactive organic compounds relating to the invention, compounds usable as a host compound will be described below.

Reactive organic compounds which are usable as a host compound are represented by the following formula (1):

A-B           Formula (1)

Wherein B is a reactive substituent, as described above and A is a partial structure exhibiting a function as a host compound.

In the invention, the foregoing A is preferably a partial structure represented by the following formula (1a) or formula (1b). Further, the partial structure represented by the formula (1a) is preferably a partial structure represented by the following formula (1c):

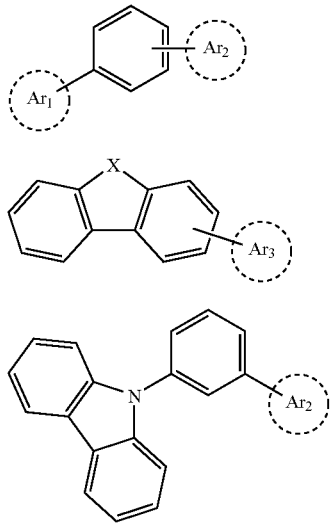

Formula (1a)

Formula (1b)

Formula (1c)

wherein $Ar_1$, $Ar_2$ and $Ar_3$ are each an aromatic hydrocarbon ring or an aromatic heterocyclic ring, and X is NR', O, S, CR'R" or SiR'R" in which R' and R" are each a hydrogen atom or a substituent.

In the foregoing formula (1a), formula (1b) and formula (1c), examples of an aromatic hydrocarbon ring represented by each of $Ar_1$, $Ar_2$ and $Ar_3$ include a benzene ring, a biphenyl ring, a naphthalene ring, an azulene ring, an anthracene ring, a phenanthrene, a pyrene ring, a chrysene ring, naphthacene ring, a triphenylene ring, o-terphenyl ring, m-terphenyl ring, p-terphenyl ring, an acenaphthene ring, a coronene ring, a fluorene ring, a fluoranthrene ring, a naphthacene, a pentacene ring, a perylene ring, a pentaphene ring, a picene ring, a pyrene ring, a pyranthrene ring, and an anthraanthrene ring. These rings may be substituted by a substituent represented by R' or R", as described later.

In the foregoing formula (1a), formula (1b) and formula (1c), examples of an aromatic heterocyclic ring represented by each of $Ar_1$, $Ar_2$ and $Ar_3$ include a furan ring, a dibenzofuran ring, a thiophene ring, an oxazole ring, a pyrrole ring, a pyridine ring, a pyridazine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, and a diazacarbazole ring (corresponding a ring in which one of carbon atoms of a hydrocarbon ring constituting a carboline ring is substituted by a nitrogen atom). These rings may be substituted by a substituent represented by R' or R", as described later.

In X of the formula (1b), examples of a substituent represented by each of R' and R" include an alkyl group (e.g., methyl ethyl, propyl isopropyl, tert-butyl, pentyl, hexyl, octyl, dodecyl, tridecyl, tetradecyl, pentadecyl), a cycloalkyl group (e.g., cyclopentyl, cyclohexyl), an alkenyl group (e.g., vinyl, allyl, 1-propenyl, 2-butenyl, 1,3-butadienyl, 2-pentenyl, isopropenyl), an alkynyl group (e.g., ethynyl, propargyl), an aromatic hydrocarbon group (also called aromatic carbon ring group or aryl group; e.g., phenyl, p-chlorophenyl, mesithyl, tolyl, xylenyl, naphthyl, anthracenyl, azulenyl, acenaphthenyl, fluorenyl, phenanthrenyl, indenyl, pyrenyl, biphenyl), an aromatic heterocyclic ring group [e.g., furyl, thienyl, pyridyl, pyridazinyl, pyrimidinyl, pyrazinyl, triazinyl, imidazolyl, pyrazolyl, thiazolyl, carbazolyl, carbolinyl, diazacarbazolyl (in which one of carbon atoms constituting a carboline ring of the foregoing carbolinyl group), phthalazinyl], a heterocyclic group (e.g., pyrrolidinyl, imidazolidinyl, morphoryl, oxyazolidinyl), an alkoxy group (e.g., methoxy, ethoxy, propyloxy, pentyloxy, hexyloxy, octyloxy, dodecyloxy), a cycloalkoxy group (e.g., cyclopentyloxy, cyclohexyloxy), an aryloxy group (e.g., phenoxy, naphthyloxy), an alkylthio group (e.g., methylthio, ethylthio, propylthio, pentylthio, hexylthio, octylthio, dodecylthio), a cycloalkylthio group (e.g., cyclopentylthio, cyclohexylthio), an arylthio group (e.g., phenylthio, naphthylthio), an alkoxycarbonyl group (e.g., methyloxycarbonyl, ethyloxycarbonyl, butyloxycarbonyl, octyloxycarbonyl, dodecyloxycarbonyl), an aryloxycarbonyl group (e.g., phenyloxycarbonyl, naphthyloxycarbonyl), a sulfamoyl group (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, 2-pyridylaminosulfonyl), an acyl group (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, pyridylcarbonyl), an acyloxy group (e.g., acetyloxy, ethylcarbonyloxy, butylcarbonyloxy, octylcarbonyloxy, dodecylcarbonyloxy, phenylcarbonyloxy), an amido group (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, naphthylcarbonylamino), a carbamoyl group (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, 2-pyridylaminocarbonyl), a ureido group (e.g., methylureido, ethylureido, pentylureido, cyclohexylureido, octylureido, dodecylureido, phenylureido, naphthylureido, 2-pyridylureido), a sulfinyl group (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, 2-pyridinylsulfinyl), an alkylsulfonyl group (e.g., methylsulfonyl, ethylsulfonyl, butylsulfonyl, cyclohexylsulfonyl, 2-ethylhexylsulfonyl, dodecylsulfonyl), an arylsulfonyl group or heteroarylsulfonyl group (e.g., phenylsulfonyl, naphthylsulfonyl, 2-pyridinylsulfonyl), an amino group (e.g., amino, ethylamino, dimethylamino, butylamino, cyclopentylamino, 2-ethylhexylamino, dodecylamino, anilino, naphthylamine, 2-pyridinylamino), a halogen atom (e.g., fluorine atom, chlorine atom, bromine atom), a fluorinated hydrocarbon group (e.g., fluoromethyl, trifluoromethyl, pentafluoroethyl, pentafluorophenyl), a cyano group, a nitro group, a hydroxy group, a mercapto group, a silyl group (e.g., trimethylsilyl, triisopropylsilyl, triphenylsilyl, phenylsilyl) and a phosphono group.

The foregoing substituents may further be substituted by substituents, as described above. Plural substituents may combine with each other to form a ring.

Specific examples of a reactive organic compound which is applicable as a host compound are shown below, but the invention is not limited to these.

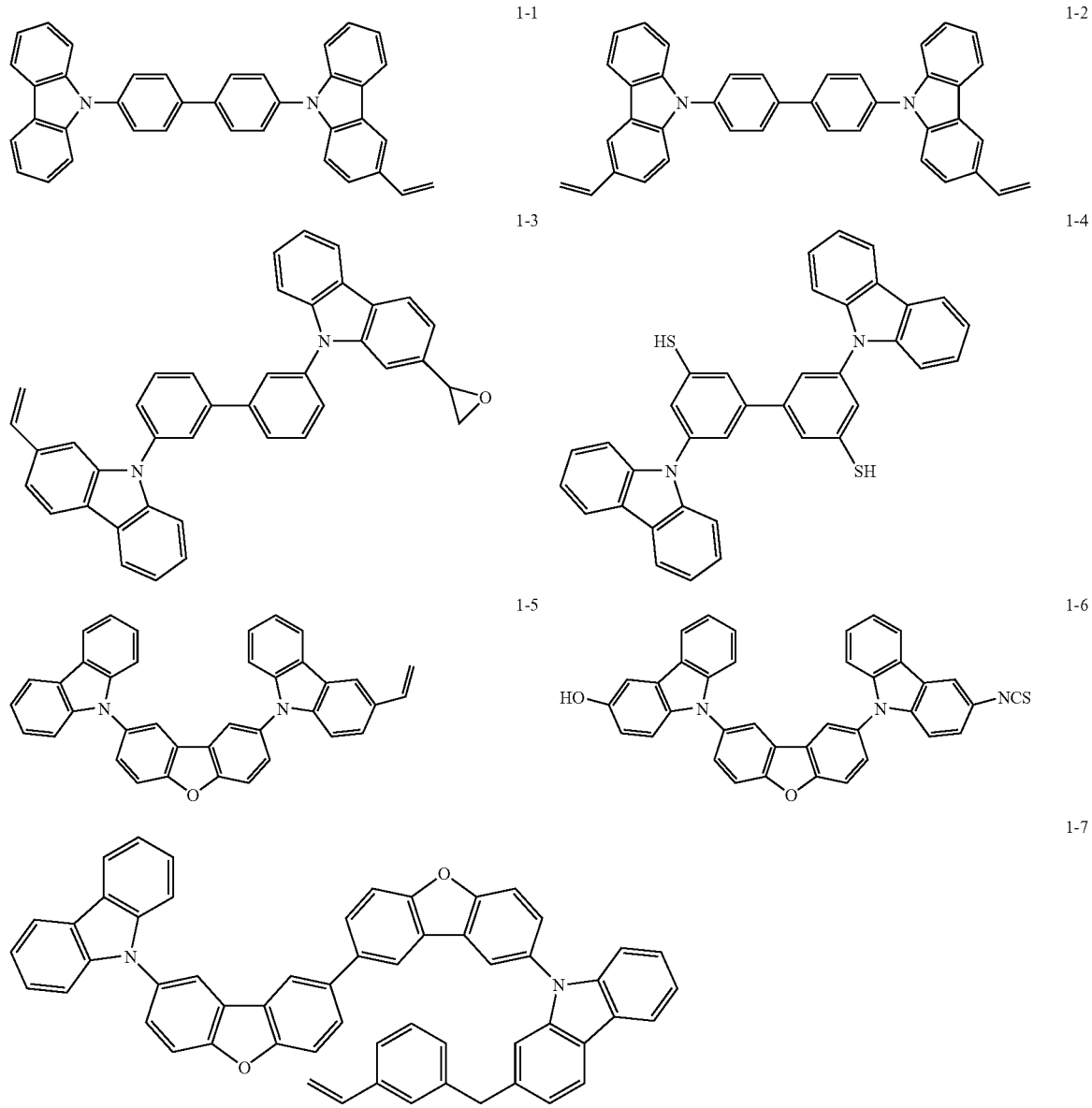

-continued
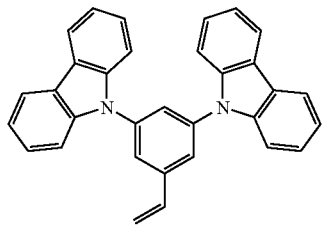
1-8
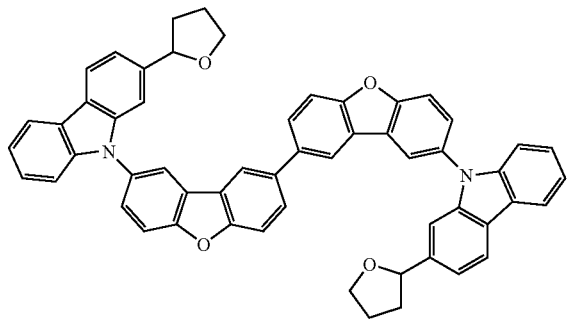
1-9
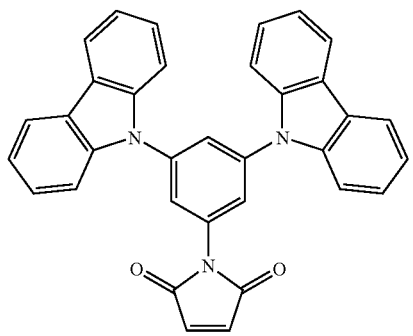
1-10
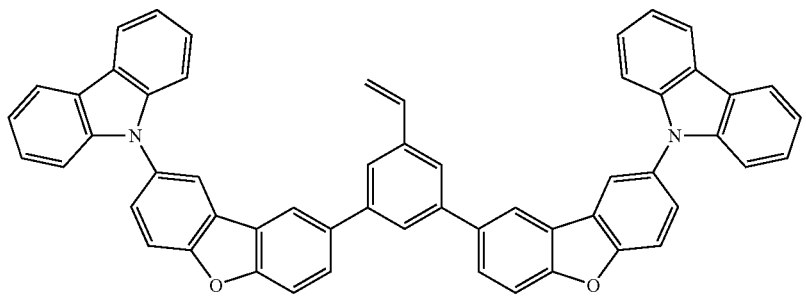
1-11
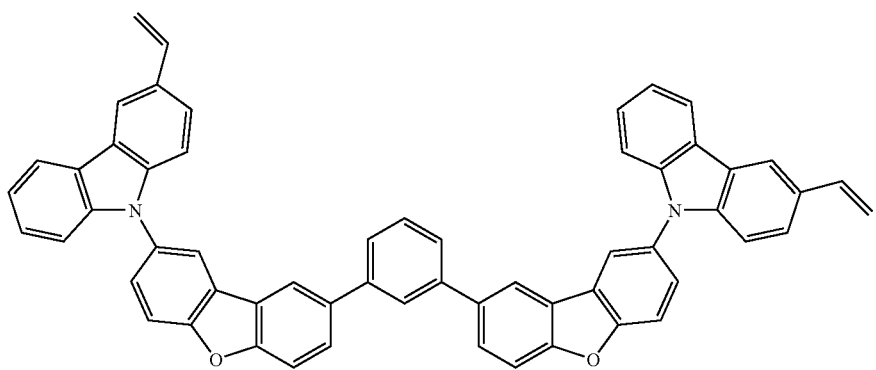
1-12

1-13
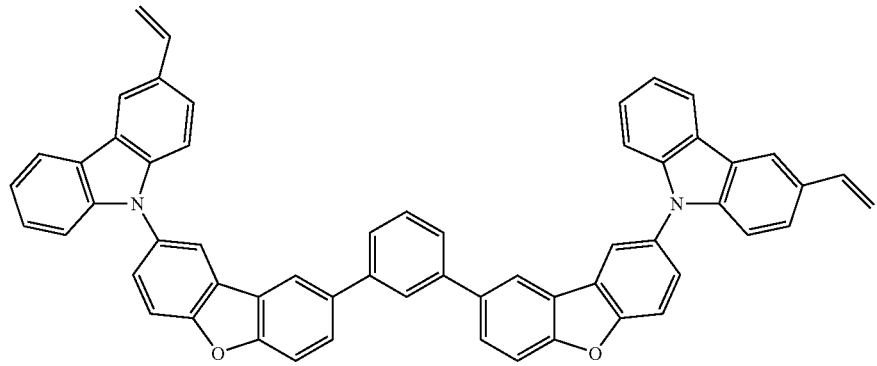
1-14
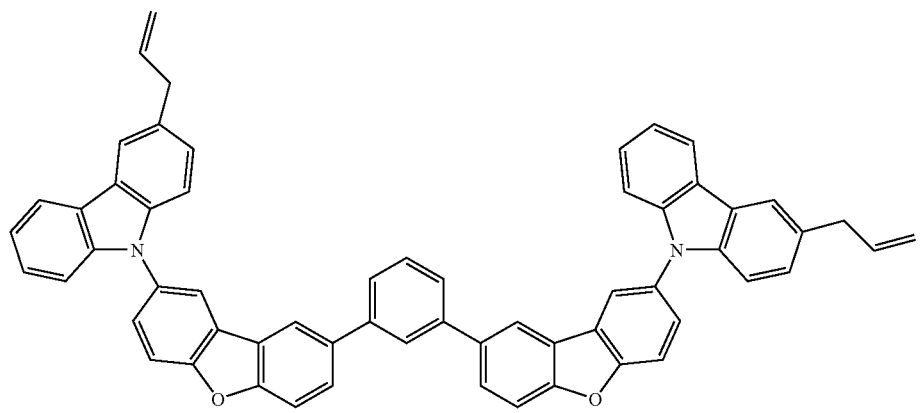
1-15
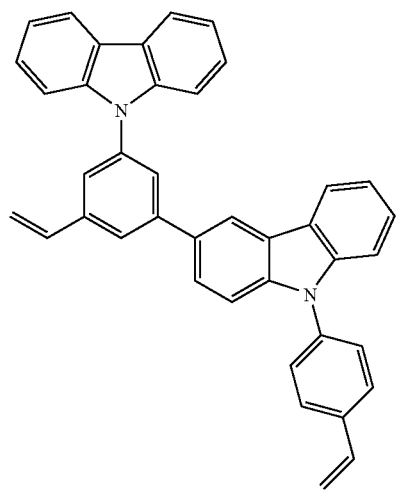
1-16
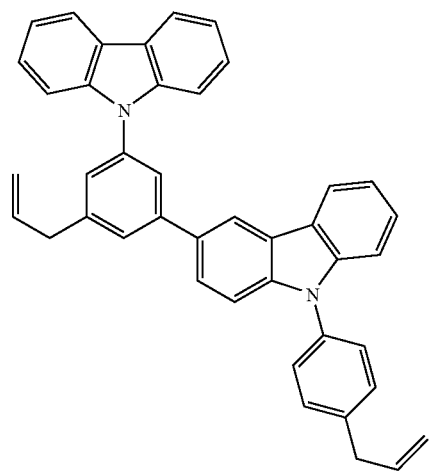

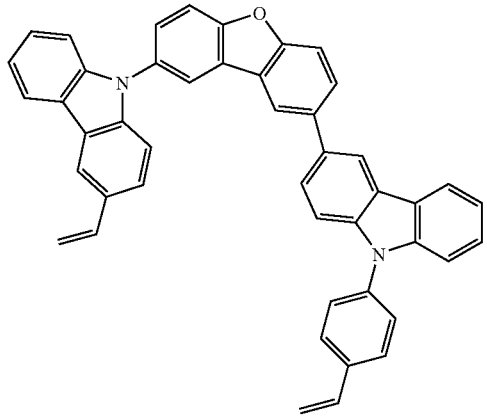
1-17
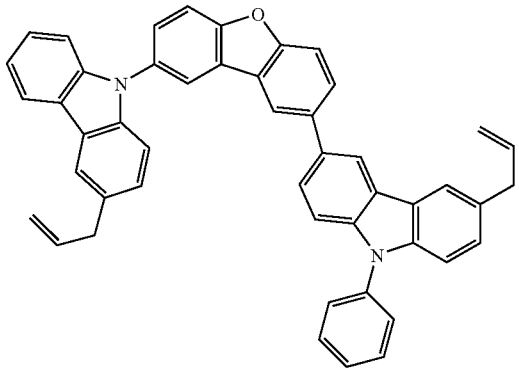
1-18
Reactive Organic Compound Other than Host Compound
Specific examples of reactive organic compounds other than host compounds are shown below but the invention is not limited to these.
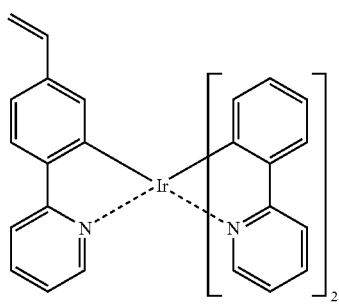
2-1
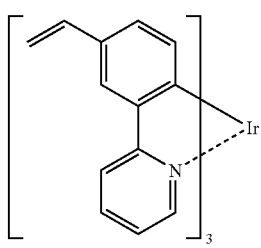
2-2
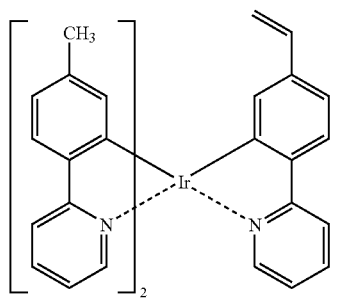
2-3
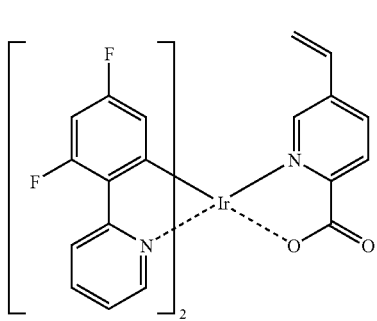
2-4
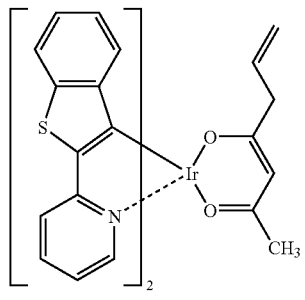
2-5
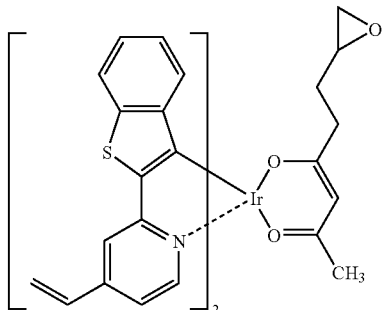
2-6

-continued
2-7
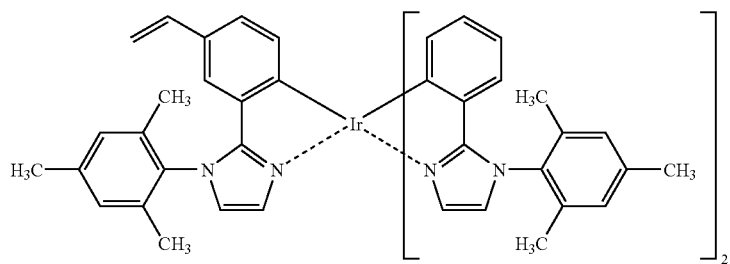
2-8
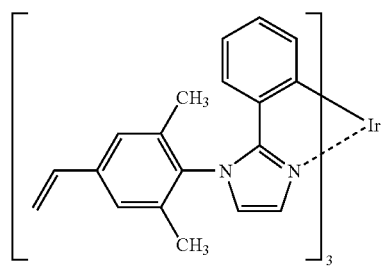
2-9
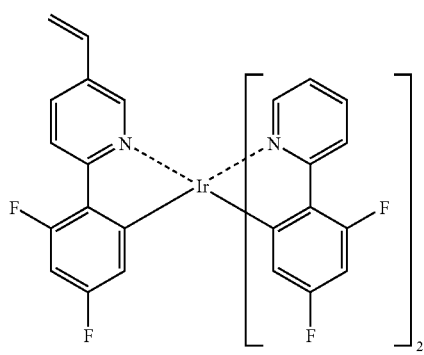
2-10
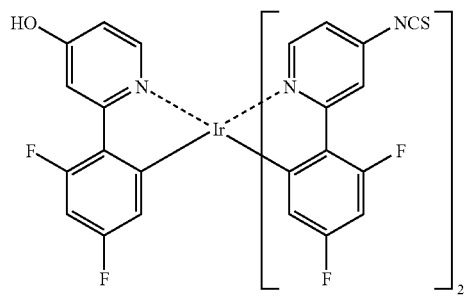
2-11
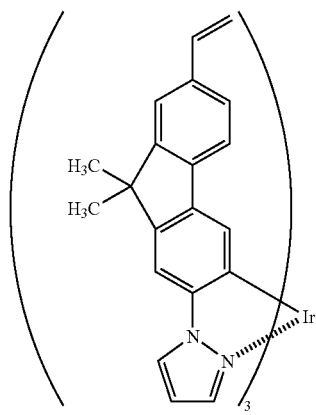
2-12
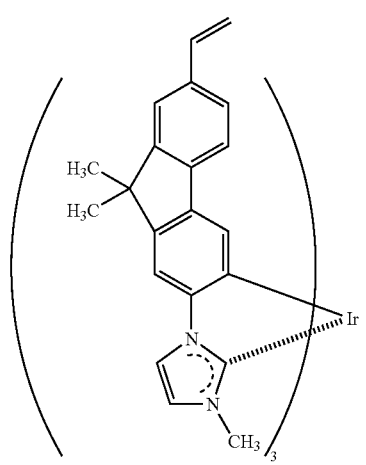
2-13
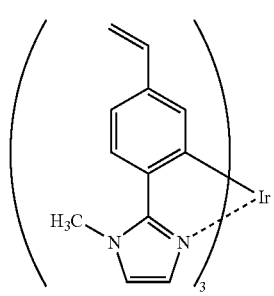

-continued
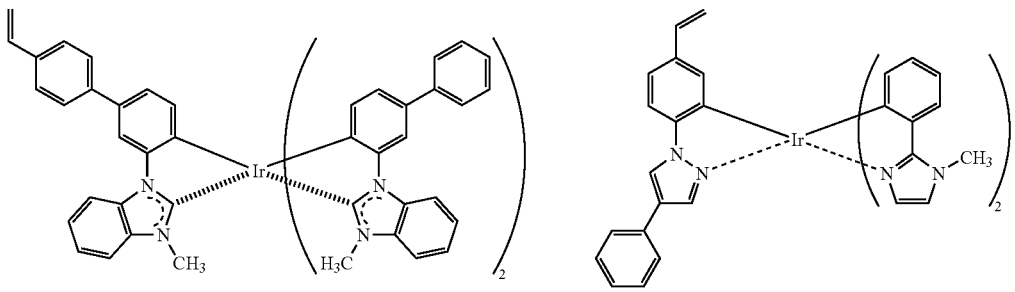
2-14
2-15
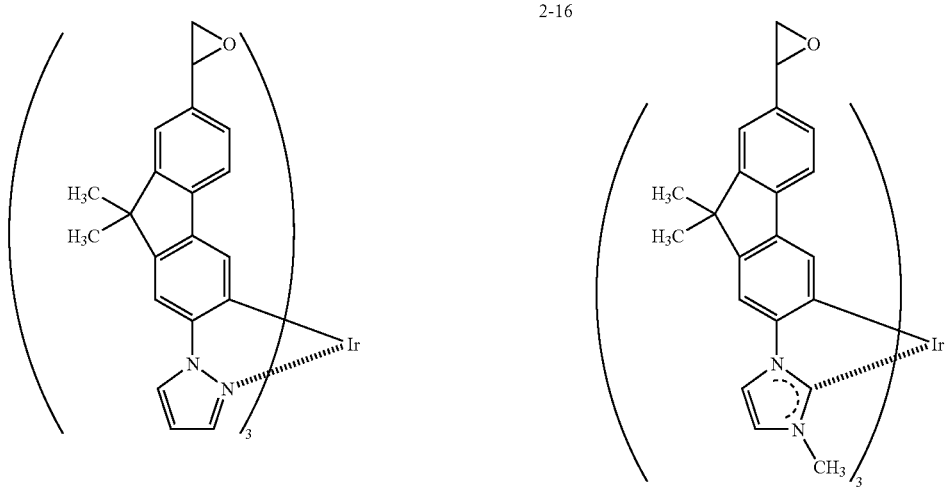
2-16
2-17
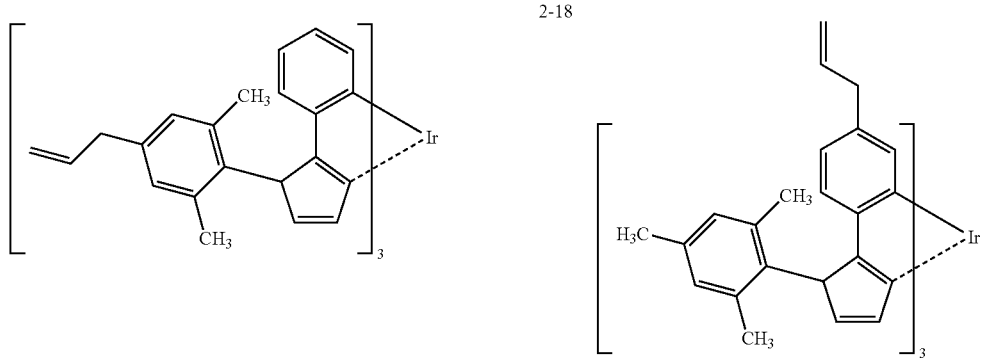
2-18
2-19
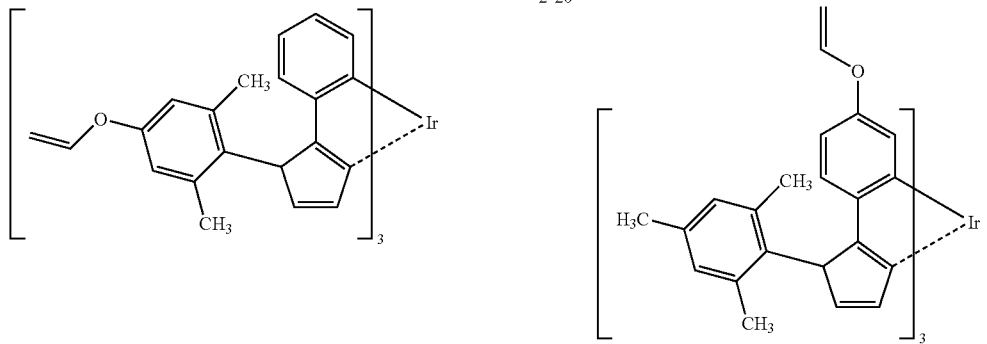
2-20
2-21

-continued
3-1
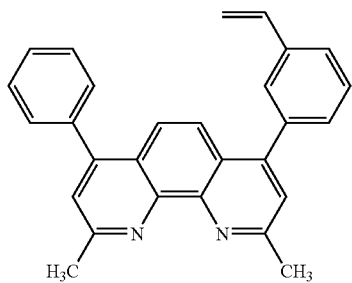
3-2
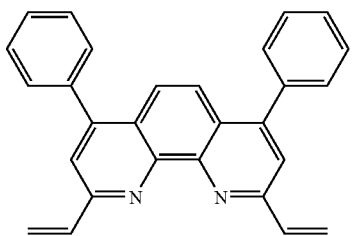
3-3
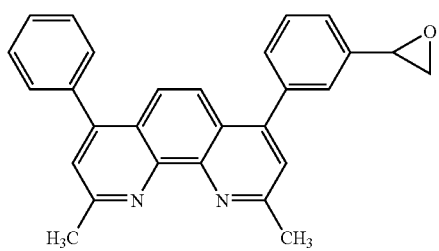
3-4
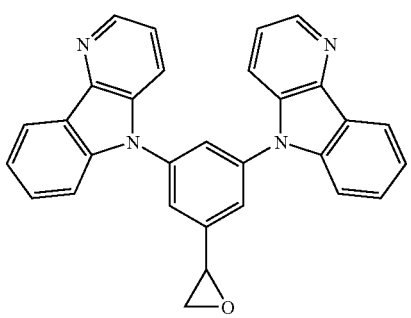
3-5
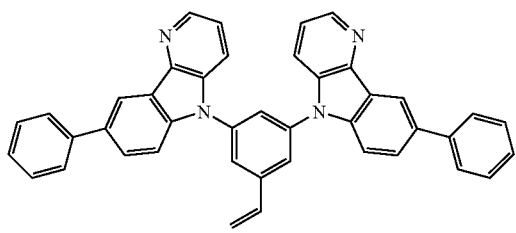
3-6
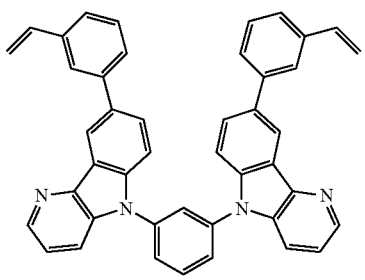
3-7
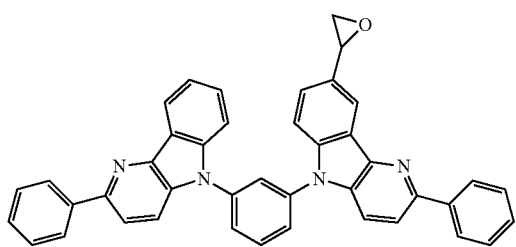
3-8
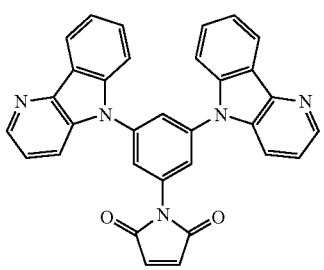
3-9
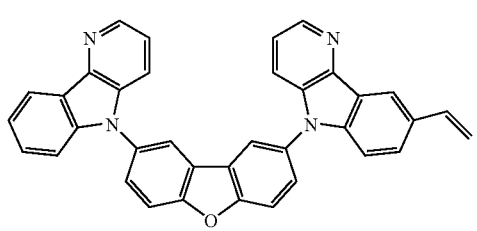
3-10
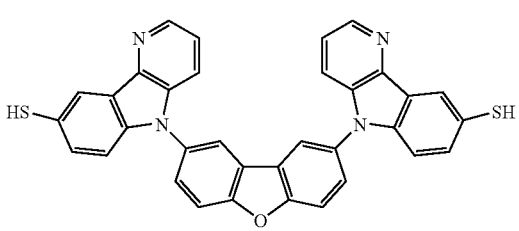

-continued
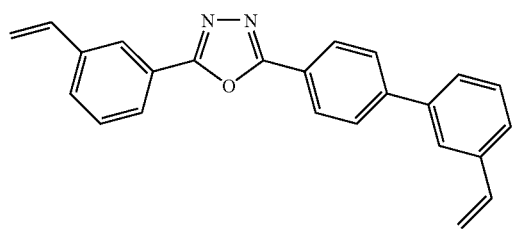
3-11
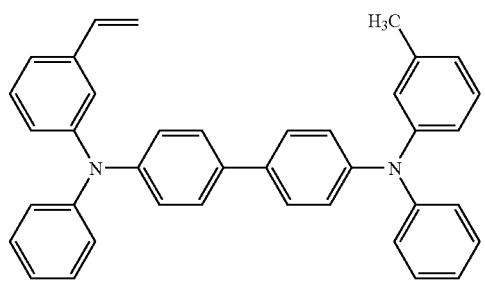
4-1
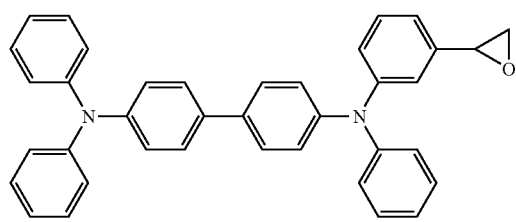
4-2
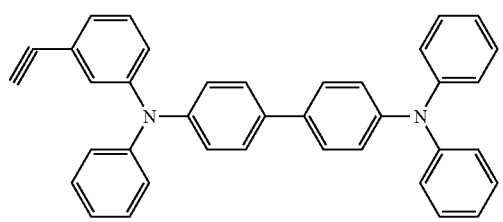
4-3
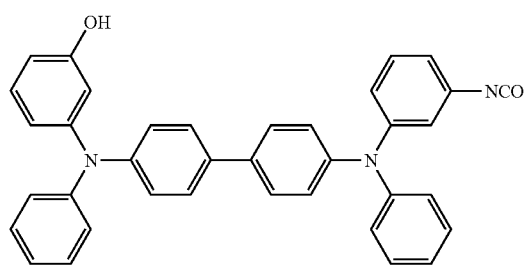
4-4
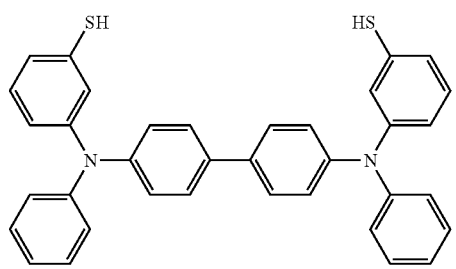
4-5
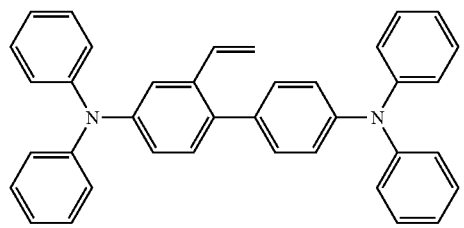
4-6
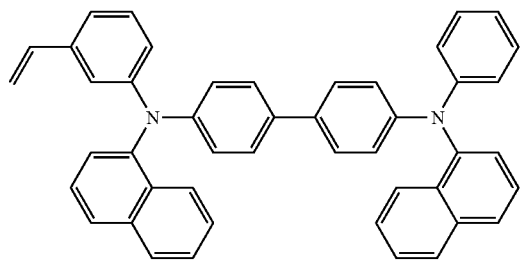
4-7
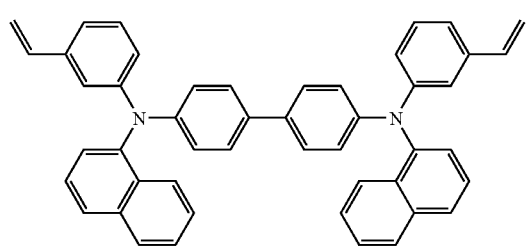
4-8
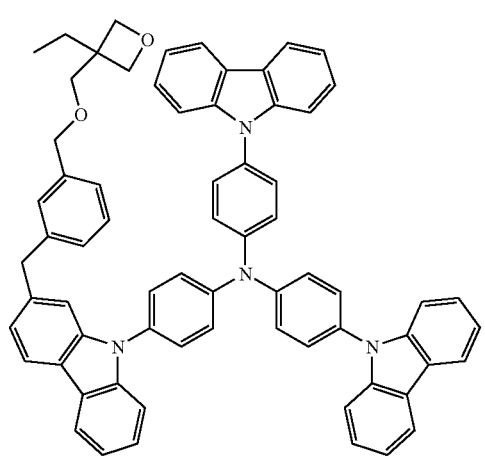
4-9

-continued
4-10
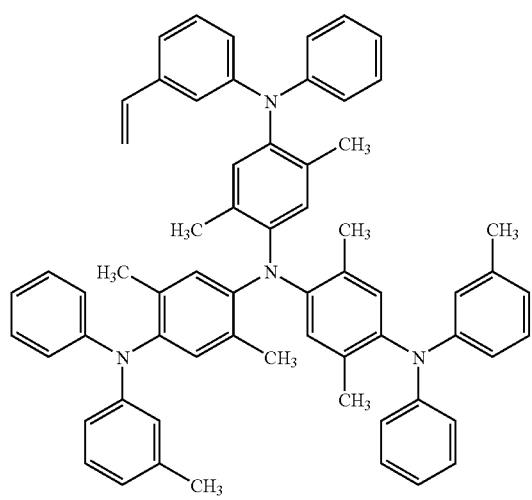
4-11
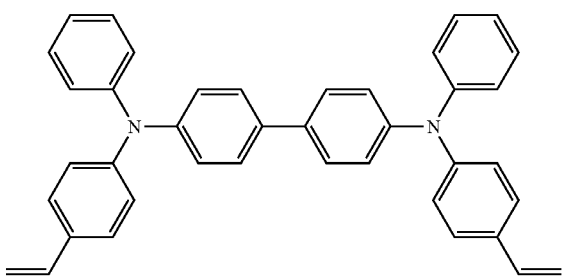
4-12
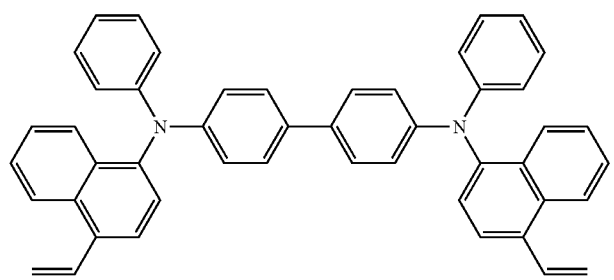
4-13
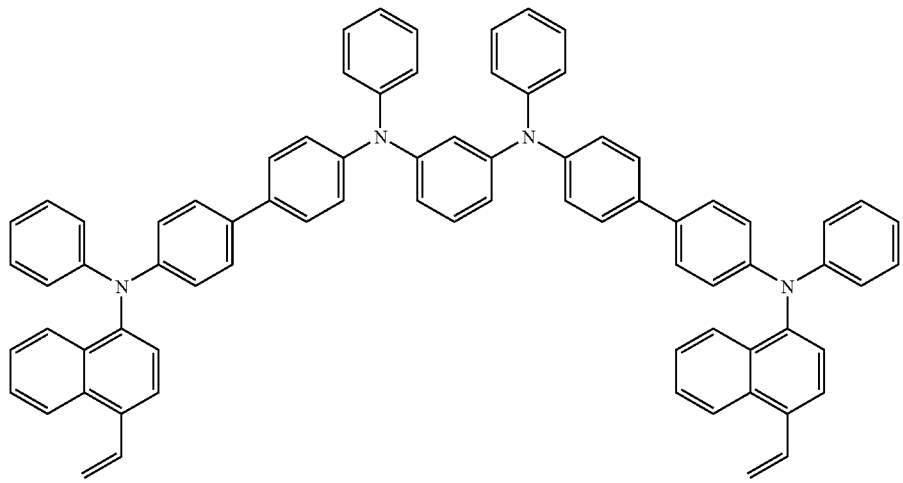
4-14
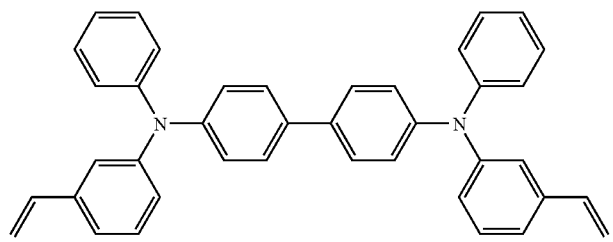

Constituent Layer of Organic EL Device

There will be described constituent layers of an organic EL device of the invention. Preferred examples of the layer configuration of the organic EL device are shown below but the invention is not limited to these.

(i) Anode/light-emitting layer/electron transport layer/cathode (ii) Anode/hole transport layer/light-emitting layer/electron transport layer/cathode (iii) Anode/hole transport layer/light-emitting layer/hole blocking layer/electron transport layer/cathode (iv) Anode/hole transport layer/light-emitting layer/hole blocking layer/electron transport layer/cathode buffer layer/cathode (v) Anode/anode buffer layer/hole transport layer/light-emitting layer/hole blocking layer/electron transport layer/cathode buffer layer/cathode In an organic EL device of the invention, a blue-light-emitting layer is preferably a monochromatic-light-emitting layer exhibiting an emission peak at a wavelength of 430-480 nm, a green-light-emitting layer is preferably a monochromatic-light-emitting layer exhibiting an emission peak at a wavelength of 510-550 nm, and a red-light-emitting layer is preferably a monochromatic light-emitting layer exhibiting an emission peak at a wavelength of 600-640 nm; and a display device using these is preferred. Further, at least these three light-emitting layers may be laminated to form a white-light-emitting layer. There may be provided a non-light-emitting interlayer between light-emitting layers. In the invention, an organic EL device is preferably a white-emitting layer and a lighting device using these is preferred.

In the following, there will be described the individual layers constituting an organic EL device relating to the invention.

Light-Emitting Layer

In a light-emitting layer relating to the invention, an electron and a hole which are injected from an electrode, an electron transport layer or a hole transport layer, are recombined to produce luminescence. The light-emitting portion may be in the interior of the light-emitting layer or at the interface between the light-emitting layer and an adjacent layer.

The total thickness of a light-emitting layer is not specifically limited but is preferably from 2 nm to 5 μm in terms of uniformity of the layer, prevention of applying unnecessary high-voltage during emission and stability of emitted color from the driving current, and is more preferably controlled to the range of from 2 nm to 200 nm and still more preferably from 10 nm to 20 nm.

A light-emitting layer can be prepared in such a manner that a light-emitting host compound and a light-emitting dopant, as described later are formed by a commonly known film-forming method such as a vapor deposition method, a spin-coating method, a casting method, an LB method or an ink-jet method.

A light-emitting layer of an organic EL device relating to the invention preferably contains a light-emitting host compound and at least one light-emitting dopant [phosphorescent dopant (also called phosphorescence-emitting dopant), fluorescent dopant, and the like].

Host Compound

There will be described a host compound (also called a light-emitting host) used in the invention.

In the invention, "host compound" is defined as a compound which is contained in a light-emitting layer at an amount of not less than 20% by mass of the phosphorescent layer and emits phosphorescence at a phosphorescence quantum efficiency of less than 0.1, and preferably less than 0.01 at room temperature. The mass ratio in the light-emitting layer is preferably not less than 20% of the compounds contained in the layer.

Host compounds include commonly known host compounds, which may be used singly or in combination. The use of plural host compounds can control charge transfer, leading to enhanced efficiency of an organic EL device. The use of plural light-emitting dopants makes it feasible to mix different light emissions, enabling to obtain any luminescent color.

A light-emitting host usable in the invention may be commonly known low-molecular compounds or a high-molecular compound having a repeating unit, or may be a low-molecular compound having a polymerizable group such as a vinyl group or a epoxy group (also called vapor-depositing polymerizable host).

Commonly known host compounds which may be usable in combination are preferably those having hole-transportability or electron-transportability and being capable of inhibiting shifting to longer wavelengths and exhibiting a high Tg (glass transition point).

Specific examples of commonly known host compounds include compounds described in the following literatures: JP-A 2001-257076, ibid 2002-308855, ibid 2001-313179, ibid 2002-319491, ibid 2001-357977, ibid 2002-334786, ibid 2002-8860, ibid 2002-334787, ibid 2002-15871, ibid 2002-334788, ibid 2002-43056, ibid 2002-334789, ibid 2002-75645, ibid 2002-338579, ibid 2002-105445, ibid 2002-343568, ibid 2002-141173, ibid 2002-352957, ibid 2002-203683, ibid 2002-363227, ibid 2002-231453, ibid 2003-3165, ibid 2002-234888, ibid 2003-231453, ibid 2003-3165, ibid 2002-234888, ibid 2003-27048, ibid 2002-255934, ibid 2002-260861, ibid 2002-280183, ibid 2002-299060, ibid 2002-302516, ibid 2002-305083, ibid 2002-305084 and ibid 2002-308837.

Light-Emitting Dopant

There will be described light-emitting dopants relating to the invention.

Light-emitting dopants usable in the invention include a fluorescent dopant (also called fluorescent compound) and a phosphorescent dopant (also called a phosphorescing material, phosphorescent compound or phosphorescing compound). To obtain an organic EL device exhibiting enhanced light emission efficiency, a phosphorescence dopant, together with the foregoing host compound is preferred as a light-emitting dopant for use in a light-emitting layer or in a light-emitting unit of an organic EL device relating to the invention.

Phosphorescent Dopant

There will be described phosphorescent dopants relating to the invention.

A phosphorescent dopant relating to the invention is defined as a compound achieving luminescence from an excited triplet, specifically, a compound phosphorescing at room temperature (25° C.) and a compound exhibiting a phosphorescence quantum efficiency of not less than 0.01 at 25° C., and preferably not less than 0.1.

The foregoing phosphorescence quantum efficiency can be determined according to the method described in "Jikken Kagaku Koza (Series of Experimental Chemistry), Fourth Edition, vol. 7, Spectroscopy II, p. 398 (1992, published by Maruzen). A phosphorescence quantum efficiency in a solution can be measured using various solvents. A phosphorescent dopant may be any one achieving the foregoing phosphorescence quantum efficiency (i.e., not less than 0.01) in any solvent.

Phosphorescent dopants are principally classified into two types, that is, an energy transfer type in which carriers recombine on a host compound transporting carriers to form an excited state of the host compound, the energy of which is transferred to a phosphorescent dopant to obtain luminescence from the phosphorescent dopant; and a carrier trap type in which a phosphorescent dopant acts as a carrier trap and recombination of carriers is caused on the phosphorescent dopant to obtain luminescence from the phosphorescent dopant. In each case, it is a requirement that the excited state energy of the phosphorescent dopant is lower than that of the host compound.

Phosphorescent dopants may be selected from commonly known ones used in a light-emitting layer of an organic EL device.

A phosphorescent dopant relating to the invention is preferably a complex compound containing a metal chosen from groups 8 to 10 inclusive of the periodical table of elements, more preferably an iridium compound, an osmium compound, a platinum compound (platinum complex compound) or a rare earth metal complex, and of these, an iridium compound is specifically preferred.

Specific examples of compounds used as a phosphorescent dopant are shown below but the invention is not limited to these. These compounds can be synthesized according to the method described in Inorg. Chem. 40, 1704-1711.

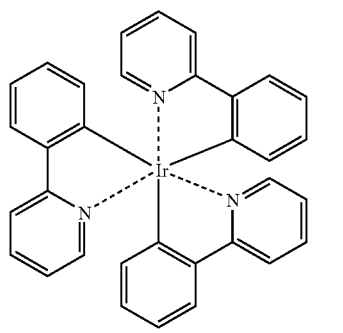

Ir-1

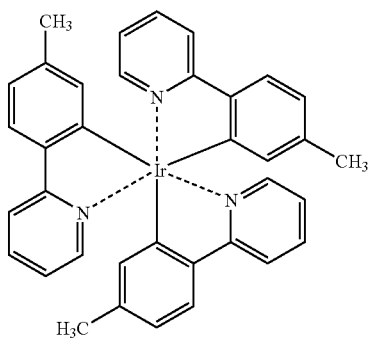

Ir-2

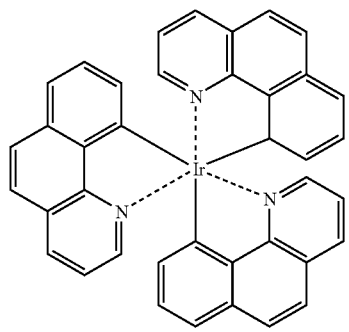

Ir-3

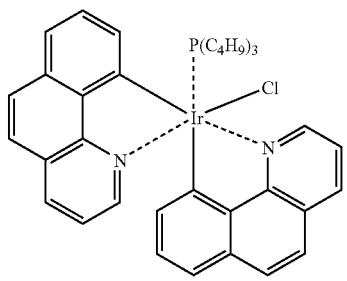

Ir-4

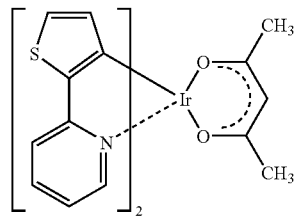

Ir-5

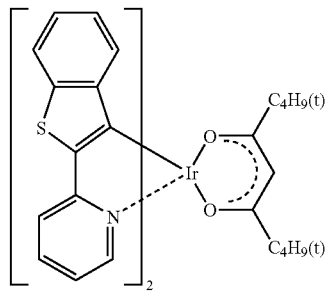

Ir-6

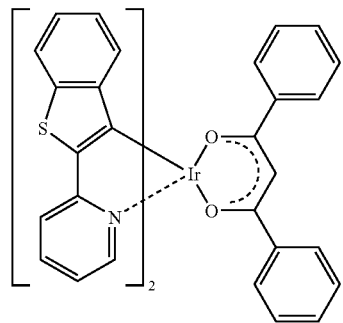

Ir-7

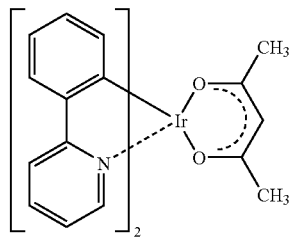

Ir-8

Ir-9
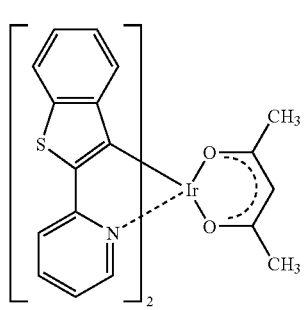
Ir-10
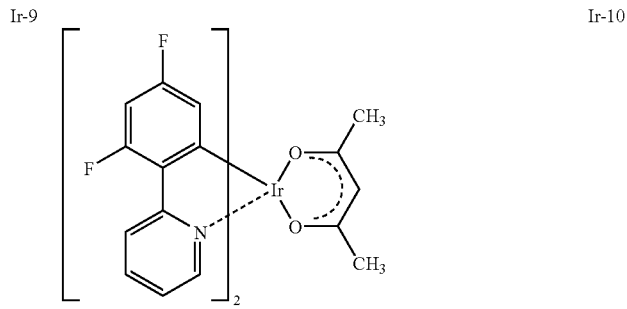
Ir-11
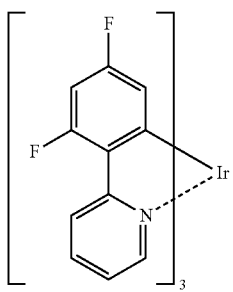
Ir-12
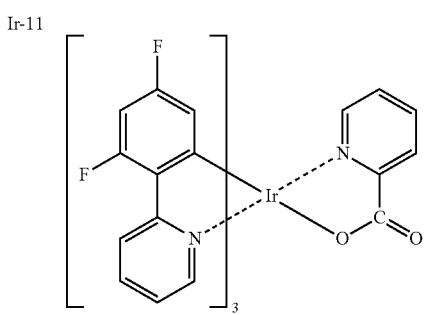
Ir-13
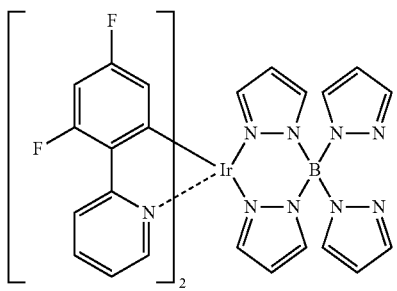
Ir-14
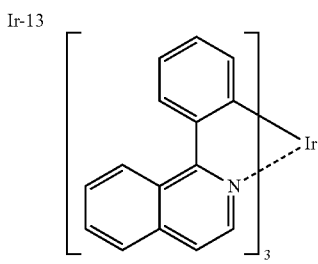
Ir-15
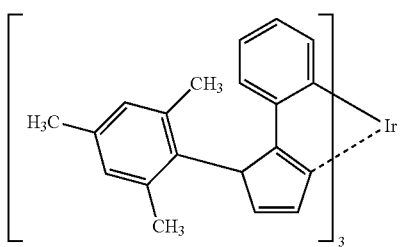
Ir-16
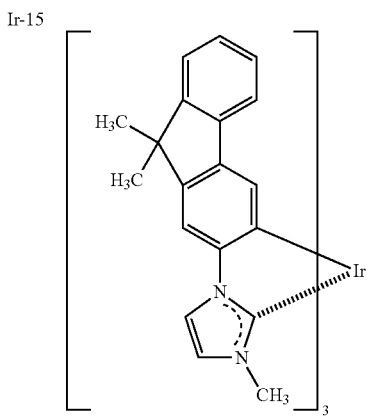

-continued
Ir-17
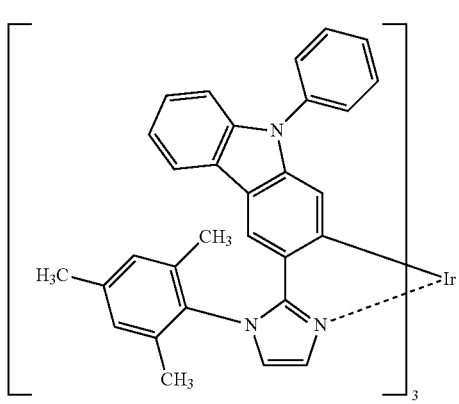
Pt-1
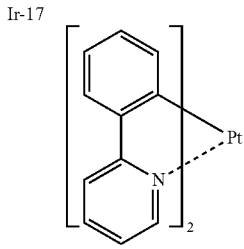
Pt-2
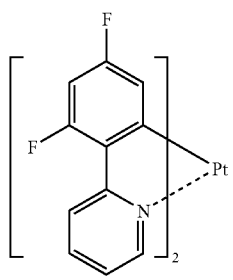
Pt-3
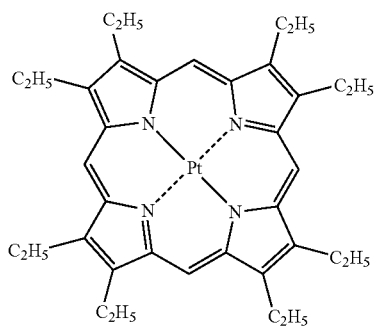
A-1
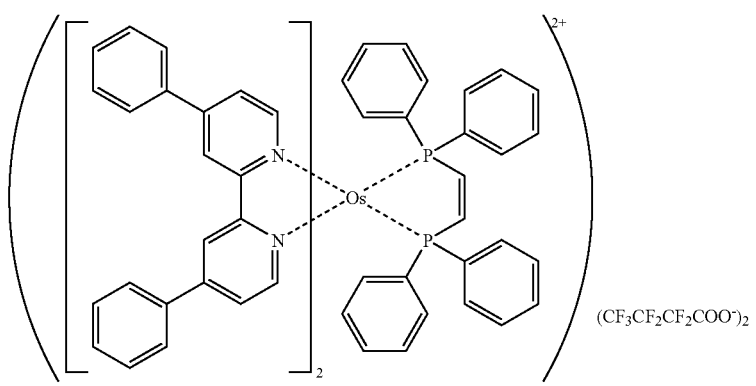
D-1
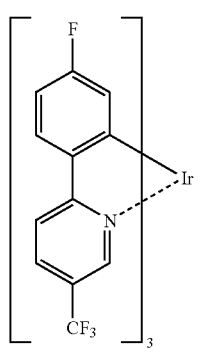
D-2
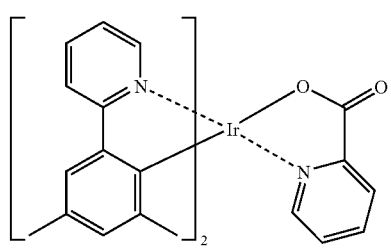

-continued
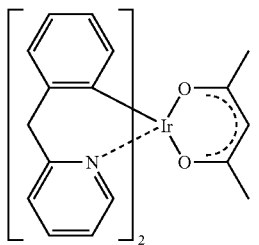
D-3
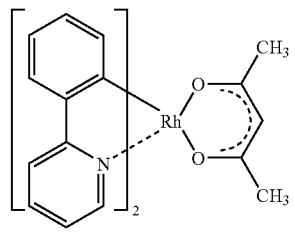
D-4
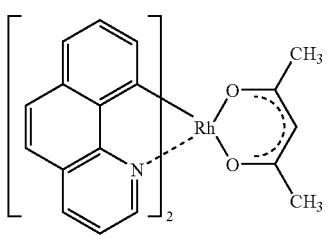
D-5
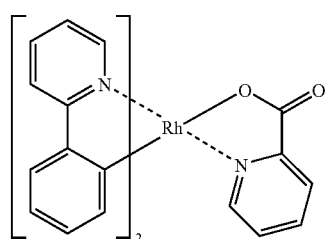
D-6
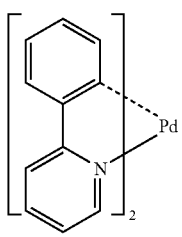
Pd-1
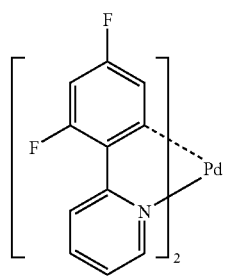
Pd-2
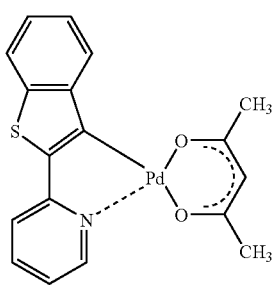
Pd-3
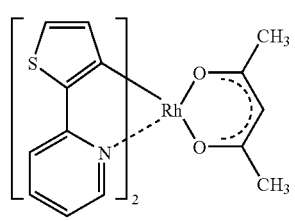
Rh-1
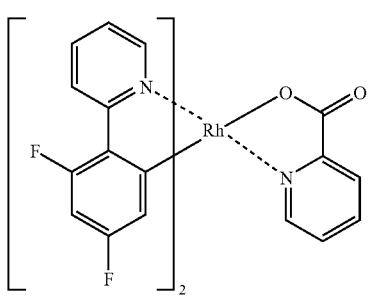
Rh-2
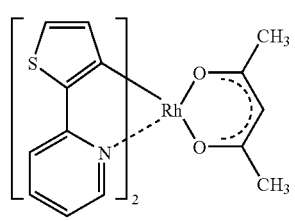
Rh-3

Fluorescent Dopant

Fluorescent dopants (also called fluorescent compound) include a coumalin dye, a pyrane dye, a cyanine dye, a chroconium dye, a squalium dye, an oxobenzanthracene dye, a fluorescein dye, a rhodamine dye, a pyrylium dye, a perylene dye, a stilbene dye, a poly-thiophene dye and a rare earth metal complex phosphor.

In the following, there will be described constituent layers of an organic EL device relating to the invention, including an injection layer, a blocking layer, and an electron transport layer.

Injection Layer

An injection layer is optionally provided, including an electron injection layer and a hole injection layer, and may be disposed between an anode and a light-emitting layer or a hole transport layer, or between a cathode and a light-emitting layer or an electron transport layer.

The injection layer is provided between an electrode and an organic layer to inhibit lowering of driving voltage or enhancement of emission luminance, as detailed in "Yuki EL Soshi To Sono Kogyoka Saizensen (Organic EL and Frontier of Its Industrialization" (published by NTS Co.) Part 2, chapter 2 "Denkyoku Zairyo (Electrode Material)" (pp. 123-166), and including a hole injection layer (anode buffer layer) and an electron injection layer (cathode buffer layer).

The anode buffer layer (hole injection layer) is detailed in JP-A 9-45479, ibid 9-260062 and ibid 8-288069, and specific examples thereof include a phthalocyanine buffer layer, typified by copper phthalocyanine; an oxide buffer layer, typified by vanadium oxide; an amorphous carbon buffer layer; and a polymer buffer layer using a conductive polymer such as poly-aniline or poly-thiophene.

The cathode buffer layer (electron injection layer) is detailed in JP-A 6-325871, ibid 9-17574 and ibid 10-74586, and specific examples thereof include a metal buffer layer, typified by strontium or aluminum; an alkali metal compound buffer layer, typified by lithium fluoride; an alkaline earth metal compound buffer layer, typified by magnesium fluoride; and an oxide buffer layer, typified by aluminum oxide. The foregoing buffer layer (injection layer) is desired to be thinned and its thickness is preferably within the range of from 0.1 nm to 5 µm.

Blocking Layer

A blocking layer is optionally provided in addition to the basic layer constitution of thin organic compound layers. Such a blocking layer includes a hole blocking layer and an electron blocking layer. Examples thereof include a hole inhibition (hole-blocking) layer, as described in JP-A 11-204258, ibid 11-204359, and "Yuki EL Soshi To Sono Kogyoka Saizensen" (published by N.T.S. Co., Nov. 30, 1998).

A hole blocking layer, which functions as an electron transport layer in a broad sense, is composed of a hole-inhibiting material having electron-transporting capability with extremely reduced hole-transporting capability and inhibits holes, while transporting electrons, resulting in enhanced recombination probability of electrons and holes. Further, constitution of an electron transport layer, as described later may optionally be used as a hole blocking layer relating to the invention.

The hole blocking layer of an organic EL device relating to the invention is provided preferably adjacent to a light-emitting layer.

A hole blocking layer preferably contains an aza-carbazole derivative as a host compound as described above.

In the invention, when a light-emitting layer is comprised of plural luminescence-emitting layers differing in emitting color, a layer emitting light having the shortest peak wavelength is preferably nearest to an anode. In that case, it is preferred to provide a hole blocking layer between the said shortest wavelength luminescence layer and a layer next-closer to the anode. Further, at least 50% by mass of compounds contained in the thus provided hole blocking layer preferably exhibits a greater ionization potential by at least 0.3 eV than the shortest wavelength luminescence layer.

The ionization potential is defined as the energy necessary to release an electron occupied at the HOMO (highest-occupied molecular orbital) level of a compound to the vacuum level and can be determined, for instance, by the following method.

(1) A value obtained by performing structure optimization using Gaussian 98 as a software for molecular orbital calculation (Gaussian 98, Revision A. 11.4., M. J. Frisch, et al., Gaussian, Inc., Pittsburgh Pa., 2002) and also using B3LYP/6-31G* as a key word, is rounded to one decimal place is determined as the ionization potential (value converted to eV units). Effective background for this calculated value includes high correlation between the calculated value obtained by this method and an experimental value.

(2) An ionization potential can also be directly determined by photoelectron spectroscopy. For instance, there can be employed a low-energy photoelectron spectroscope, Model AC-1, produced by Riken Keiki CO., Ltd., or a method known as ultraviolet photoelectron spectroscopy.

An electron blocking layer, which functions as a hole transport layer in a broad sense, is composed of an electron-inhibiting material having hole-transporting capability with extremely reduced electron-transporting capability and blocks electrons, while transporting holes, resulting in enhanced recombination probability of electrons and holes.

Further, constitution of a hole transport layer, as described later may optionally be used as an electron blocking layer relating to the invention. The thickness of a hole blocking layer or an electron blocking layer relating to the invention is preferably from 3 to 100 nm, and more preferably from 5 to 30 nm.

Hole Transport Layer

A hole transport layer, which is composed of a hole transporting material having a hole transport function, includes a hole injection layer and an electron blocking layer in a broad sense. A hole transport layer may be formed of a single layer or plural layers.

A hole transport material is one capable of performing hole injection or transport, or exhibiting electron barrier, including any one of organic and inorganic materials. Examples thereof include triazole derivatives, oxadiazole derivatives, imidazole derivatives, polyarylalkane derivatives, pyrazoline and pyrazolone derivatives, phenylenediamine derivatives, arylamine derivatives, amino-substituted chalcogen derivatives, oxazole derivatives, styrylanthracene derivatives, fluorenone derivatives, hydrazone derivatives, stilbene derivatives, silazane derivatives, aniline copolymers, and conductive polymeric oligomers such as thiophene oligomer.

Hole transport materials can use the foregoing materials, but porphyrin compounds and aromatic tertiary amine compounds and styrylamine compounds are preferred and aromatic tertiary amine compounds are specifically preferred.

Representative examples of aromatic tertiary amine compounds and styrylamine compounds include N,N,N',N'-teraphenyl4,4'-diaminophenyl, N,N'-diphenyl-N,N'-bis(3-methylphenyl)-[1,1'-biphenyl]-4,4'-diamine (TPD), 1,1'-bis(4-di-p-tolylaminophenyl)cyclohexane, N,N,N',N'-tetra-p-tolyl-4,4'-diaminobiphenyl, 1,1-bis(4-di-p- tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'tetraphenyl-4,4'-diaminodiphenyl ether, 4,4'-bis(diphenylamino)-4'-[4-(di-p-tolylamino)styryl]stilbene, 4-N,N-diphenylamino-(2-diphenylvinyl)benzene, 3-methoxy-4'-N,N-diphenylaminostyrylbenzene and N-phenylcarbazole; compounds containing two condensed aromatic rings in the molecule, for example, 4,4'-bis[N-(1-naphthyl)-N-phenylamino]biphenyl (NPD), as described in U.S. Pat. No. 5,061,569; and 4,4',4''-tris[N-(3-methylphenyl)-N-phenylamino]triphenylamine (MTDATA) in which three triphenylamine units are linked through star-burst type, as described in JP-A 4-308688.

There are also usable polymeric materials having introduced the foregoing materials to a polymer chain or including the foregoing materials as a polymer backbone. Further, inorganic compounds such as p-type Si and P-type SiC are also usable as a hole injection material or a hole transport material.

There are also usable so-called p-type hole transport materials, as described in JP-A 11-251067 and literature of J. Huang et al. [Applied Physics Letters 80 (2002), p. 139]. Since a luminescence device of enhanced efficiency is obtained, these materials are preferably used in the invention.

A hole transport layer can be formed in such a manner that the foregoing hole transport material is applied by a commonly known film-forming method such as a vapor deposition method, a spin-coating method, a casting method, an LB method or an ink-jet method. The thickness of a hole transport layer is not specifically limited but is usually from 5 nm to 5 μm, preferably from 5 nm to 200 nm. The hole transport layer may be a single layer structure comprised of at least one of the foregoing materials.

There is also usable an impurity-doped hole transport layer of relatively high p-type property. Examples thereof include those described in JP-A 4-297076, 2000-196140, 2001-102175 and J. Appl. Phys., 95, 5773 (2004).

The use of such a hole transport layer of relatively high p-type property, which enables preparing a device of low electric power consumption, is preferred in the invention.

Electron Transport Layer

An electron transport layer, which is composed of an electron transporting material having an electron transport function, include an electron injection layer and a hole blocking layer in a broad sense. An electron transport layer may be provided with a single layer or plural layers.

An electron transport material (which also plays a role as a hole blocking layer) used in an electron transport layer of single layer constitution or an electron transport layer adjacent to a cathode in the case of plural layer constitution may have a function of transporting an electron injected from a cathode into a light-emitting layer. Such a material can be chosen from compounds known in the art and examples thereof include nitro-substituted fluorene derivatives, diphenylquinone derivatives, thiopyrane dioxide derivatives, a carbodiimide, fluorenylidenemethane derivatives, anthraquinodimethane and anthrone derivatives and oxadiazole derivatives. There are also usable, as an electron transport material, thiadiazole derivatives in which an oxygen atom of the foregoing oxadiazole derivatives is replaced by a sulfur atom, and quinoxaline derivatives having a quinoxaline ring known as an electron-withdrawing group. There are also usable polymeric materials having introduced the foregoing materials as a side chain or a backbone of a polymer.

There are usable, as an electron transport material, metal complexes of 8-quinolinol derivatives, for example, tris(8-quinolinol)aluminum (alq), tris(5,7-dichloro-8-quilinol)aluminum, tris(5,7-dibromo-8-quilinol)aluminum, tris(2-methyl-8-quinolinol)aluminum, tris(5-methyl-8-quinolinol) aluminum, bis(8-quilinol)zinc (Znq), and metal complexes in which the central metal of the foregoing metal complexes was replaced by In, Mg, Cu, Ca, Sn, Ga, or Pb. Further, metal-free or metal phthalocyanine and one, the end of which is substituted by an alkyl group or a sulfonic acid group are also usable as a preferred electron transport material. Distyrylpyrazine derivatives exemplified as a material of a light-emitting layer are also usable as an electron transport material. Similarly to a hole injection layer and a hole transport layer, inorganic semiconductors such as an n-type Si and an n-type SiC are usable as an electron transport material.

An electron transport layer can be formed in such a manner that the foregoing electron transport material is applied by a commonly known film-forming method such as a vapor deposition method, a spin-coating method, a casting method, an LB method or an ink-jet method. The thickness of an electron transport layer is not specifically limited but is usually from 5 nm to 5 μm, preferably from 5 nm to 200 nm. The electron transport layer may be a single layer structure comprised of at least one of the foregoing materials.

There is also usable an impurity-doped electron transport layer of relatively high n-type property. Examples thereof include those described in JP-A 4-297076, 10-270172, 2000-196140, 2001-102175 and J. Appl. Phys., 95, 5773 (2004).

The use of such an electron transport layer of relatively high n-type property, which enables preparing a device of low electric power consumption, is preferred in the invention.

Anode

An anode of an organic EL device preferably employs, as an electrode substance, a metal, an alloy, an electrically conductive substance and a mixture of these, which exhibit a large work function (at least 4 eV). Specific examples of such an electrode substance include electrically conductive transparent materials such as a metal, e.g., Au, indium tin oxide (ITO), $SnO_2$, and ZnO. There may be also used a non-crystalline material capable of forming a transparent conductive film, such as IDIXO ($In_2O_3$—ZnO). An anode may be formed by subjecting such electrode substances to vapor deposition or sputtering to form a thin layer, followed by a photolithography method to form the desired pattern. Alternatively, in the case of not necessitating a high pattern accuracy (at a level of more than 100 μm), a pattern may be formed through a mask of a desired form at the time of vapor deposition or sputtering of the electrode substance. A wet film forming method such as a printing system or a coating system is applicable to a coatable substance such as an organic conductive compound. An anode preferably exhibits a transparency of at least 10% to extract light therefrom and the sheet resistance as an anode is preferably not more than some hundreds Ω/□. The layer thickness is usually from 10 to 1000 nm and preferably from 10 to 200 nm.

Cathode

On the other hand, the cathode of an organic EL device preferably employs, as an electrode substance, a metal (called an electron-injecting metal), an alloy, an electrically conductive substance or a mixture of these, which exhibit a small work function (not more than 4 eV). Specific examples of such an electrode substance include sodium, sodium-potassium alloy, magnesium, lithium, a magnesium-copper mixture, a magnesium-silver mixture, a magnesium-aluminum mixture, a magnesium-indium mixture, an aluminum-aluminum oxide ($Al_2O_3$) mixture, indium, lithium-aluminum mixture, and rare earth metals. Of these, a mixture of an electron-injective metal and a second metal as a stable metal having a larger work function is preferred in terms of electron-injection property and resistance to oxidation, including, for example, a magnesium-silver mixture, a magnesium-aluminum mixture, a magnesium-indium mixture, an aluminum-aluminum oxide ($Al_2O_3$) mixture, a lithium aluminum mixture and aluminum. A cathode can be prepared by allowing these electrode substances to be vapor-deposited or sputtered to form a thin-layer. A sheet resistance as an anode is preferably not more than some hundreds $\Omega/\square$. The layer thickness is chosen usually from 10 to 1000 nm but preferably from 10 to 200 nm. To allow emitted light to be transmitted, one of the anode and cathode of an organic EL device being transparent or semi-transparent is advantageous for enhancement of emission luminance.

A transparent or semi-transparent cathode can be prepared by forming a 1-20 nm thick metal, as described above on the cathode side, followed by forming a conductive transparent material thereon and application can prepare a device having light-permeable anode and cathode.

Support Substrate

A support substrate (hereinafter, also called substrate, substrate board, substrate material or support) usable for an organic EL device relating to the invention is not specifically relevant to its kind, such as glass, plastic or the like, which may be transparent or opaque. When performing light-extraction from the support substrate side, the support substrate preferably is transparent. Preferred transparent support substrate are glass, quartz and transparent resin film. A specifically preferred support substrate is a resin film, which is capable of providing flexibility to an organic EL device.

Examples of resin film include polyester such as polyethylene terephthalate (PET) or polyethylene naphthalate (PEN), polyethylene, polypropylene, cellophane, a cellulose ester or its derivative, such as cellulose acetate, cellulose triacetate, cellulose, acetate butyrate, cellulose acetate propionate (CAP), cellulose acetate phthalate (TAC) or cellulose nitrate, polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polystyrenes, polyether imide, polyether ketone imide, polyamide, fluororesin, nylon, polymethyl methacrylate, acryl or polyarylates and cycloolefinic resin such ARTON (trade name, produced by JSR co.) or APEL (trade name, produced by Mitsui Kagaku Co., Ltd.).

The resin film surface may be formed with a coat of an inorganic material or an organic material or a hybrid coating of both of them. A barrier film exhibiting a water vapor permeability (25±0.5° C., 90±2% RH) of not more than 0.01 $g/(m^2 \cdot 24 h)$, measured according to JIS K 7129-1992 is preferred and a high-barrier film exhibiting an oxygen permeability of not more than $10^{-3}$ $ml/(m^2 \cdot 24$ $h \cdot MPa)$, measured according to JIS K 7126-1987 and a water vapor permeability of not more than $10^{-5}$ $g/(m^2 \cdot 24$ $h)$ is further preferred.

Any material functioning to inhibit penetration of substances deteriorating a device, such as moisture or oxygen, is usable as a material to form a barrier layer and there are usable, for example, silicon oxide, silicon dioxide, silicon nitride and the like. To reduce fragility of the said layer is preferred a laminated structure comprised of an inorganic layer and an organic layer. The lamination order of an inorganic layer and an organic layer is not specifically limited but preferably, both layer are alternately laminated plural times.

Methods of forming a barrier layer are not specifically limited and include, for example, a vacuum deposition method, a sputtering method, a reactive-sputtering method, a molecular be an epitaxy method, a cluster ion beam method, an ion plating method, a plasma polymerization method, an atmospheric plasma polymerization method, a plasma CVD method, a laser CVD method, a thermal CVD method, and a coating method. Of these is specifically preferred an atmospheric plasma polymerization method, as described in JP-A 2004-68143.

Examples of an opaque support substrate include a metal plate such as aluminum or stainless steel, an opaque resin substrate and a ceramic substrate.

An external light-extraction efficiency of luminescence at room temperature of an organic EL device relating to the invention preferably not less than 1%, and more preferably not less than 5%. The external light-extraction is defined as below:

External light-extraction efficiency (%)=[number of photons externally emitted from organic EL/number of electrons flown through organic EL]×100.

There may be used a color modification filter such as a color filter or a color conversion filter which converts the luminescence color from an organic EL device to another color by using a phosphor. When using a color conversion filter, the λmax of an organic EL device is preferably 480 nm or more.

Sealing

Sealing means used in the invention include, for example, a method of sticking a sealing member onto an electrode and a support substrate with an adhesive.

A sealing member, which may be disposed to cover the display region of an organic EL device, may be in the form of a recessed plate or a planar plate. Further, transparency and electric-insulating capability are not specifically regarded.

Examples include a glass plate, a polymer plate/film, and a metal plate/film. Specific examples of a glass plate include soda lime glass, barium-strontium containing glass, lead glass, aluminosilicate glass, borosilicate glass, barium borosilicate glass and quartz. Specific examples of a polymer plate include a polycarbonate, acryl, polyethylene terephthalate, polyether sulfide and polysulfone. A metal plate is one comprised of a metal or alloy chosen from the group of stainless steel, iron, copper, aluminum, magnesium, nickel, zinc, chromium, titanium, molybdenum, silicon, germanium and tantalum.

In the invention, a polymer film and a metal film are preferred in terms of a device being readily film-formed. Further, a polymer film exhibiting an oxygen permeability of not more than $1\times10^{-3}$ $ml/(m^2 \cdot 24$ $h \cdot MPa)$, measured according to JIS K 7126-1987 and a water vapor permeability of not more than $1\times10^{-3}$ $g/(m^2 \cdot 24$ $h)$, measured according to JIS K 7129-1992 is more preferred.

There is employed a sand-blasting treatment or a chemical-etching treatment to fabricate a sealing member to a concave form.

Specific examples of an adhesive include photosetting and thermosetting adhesives containing a reactive vinyl group of a (meth)acrylic acid oligomer and moisture-hardenable adhesives such as 2-cyanoacrylic acid ester. Further, thermally and chemically hardening type (two-liquid mixing) is also included. There are also included hot-melt type polyamide, polyester and polyolefin. There is further included a cation-hardening type ultraviolet-hardenable epoxy resin adhesive.

Since an organic EL device sometimes deteriorates upon a thermal treatment, an adhesive capable of being hardenable is preferred. A desiccating agent may be dispersed in the foregoing adhesive. Coating an adhesive onto a sealing portion may be conducted by using a commercially available dispenser or by printing such as screen-printing.

On the outside of the electrode on the side sandwiching an organic layer and opposing a support substrate, a layer of an inorganic material and an organic material is formed in the form of covering the electrode and the organic layer to form a sealing membrane. In that case, the material forming the membrane may be one functioning to inhibit penetration of any substance deteriorating a device, such as moisture or oxygen and, for example, silicon oxide, silicon dioxide, silicon nitride and the like are usable. To reduce fragility, the said layer is preferred to be a laminated structure comprised of an inorganic layer and an organic layer. Methods of forming such a membrane are not specifically limited and include, for example, a vacuum deposition method, a sputtering method, a reactive-sputtering method, a molecular beam epitaxy method, a cluster ion beam method, an ion plating method, a plasma polymerization method, an atmospheric plasma polymerization method, a plasma CVD method, a laser CVD method, a thermal CVD method, and a coating method.

Preferably, an inert gas such as nitrogen or argon, or an inert liquid such as a fluorinated hydrocarbon or silicone oil is filled into the gap between a sealing member and the display region of an organic EL device to form a gas or liquid phase. It is also feasible to make it a vacuum. Alternatively, a hygroscopic compound may be encapsulated.

Examples of such a hygroscopic compound include metal oxides (e.g., sodium oxide, potassium oxide, calcium oxide, barium oxide, aluminum oxide), sulfates (e.g., sodium sulfate, calcium sulfate, magnesium sulfate, cobalt sulfate), metal halides (e.g., calcium chloride, magnesium chloride, cesium fluoride, tantalum fluoride, cerium bromide, magnesium bromide, barium bromide, magnesium iodide), and perchlorates (e.g., barium perchlorate, magnesium perchlorate). In sulfates, metal halides and perchlorates, anhydrous salts are optimally employed.

Protective Membrane or Plate

A protective membrane or a protective plate may be provided on the outer side of the above-described sealing membrane or a sealing film on the side sandwiching an organic layer and opposing the support substrate. Specifically, when sealed by the above-described sealing membrane, its mechanical strength is not necessarily high so that it is preferred to provide such a protective membrane or a protective plate. Usable materials include a glass plate, a polymer plate or film, and metal plate or film, and a polymer film is preferred in terms of lightness and thin film-formation.

Light Extraction

An organic EL device emits light in the interior of a layer exhibiting a higher refraction index than air (which is approximately from 1.7 to 2.1) and light is extracted only at an amount of 15 to 20% of the light produced in the light-emitting layer. This is due to the fact that light incident to the interface (being the interface between a transparent substrate and air) at an angle (θ) more than the critical angle causes total reflection and cannot be externally extracted, or light causes total reflection at a transparent electrode or between a light-emitting layer and a transparent substrate and is wave-guided through the transparent substrate or the light-emitting layer and the result is that light is cleared in the direction of the side-face of the device. Techniques for enhancement of light-extraction efficiency include, for example, a technique of forming irregularities on the surface of a transparent substrate to inhibit total reflection at the interface between the transparent substrate and air (as described in U.S. Pat. No. 4,774,435), a technique of giving light-convergence to the substrate to enhance light-extraction efficiency (as described in JP-A 63-314795), a technique of forming a reflective surface on the side-face of a device (as described in JP-A 1-220394), a technique of introduction of a flat layer of an intermediate refraction index between the substrate and a light-emitting material to form an antireflection film (as described in JP-A 62-172691), a technique of introduction of a flat layer exhibiting a lower refraction index than the substrate being between the substrate and a light-emitting material (as described in JP-A 2001-202827), and a technique of forming a diffraction grating between the substrate and a transparent electrode layer of a light-emitting layer, inclusive of between the substrate and an external field (as described in JP-A 11-283751).

Any one of these techniques may be combined with the organic EL device of the invention, but a technique of introduction of a flat layer exhibiting a lower refraction index than that of the substrate between the substrate and a light-emitting material or a technique of forming a diffraction grating between the substrate and a transparent electrode layer of a light-emitting layer, inclusive of between the substrate and an external field is suitably applied in the invention.

In the invention, a combination of these techniques can obtain a device of enhanced luminance and superior durability.

When forming a medium of a low refraction index at a thickness greater than a light wavelength, a medium of a lower refraction index results in higher extraction efficiency of light emitted from a transparent electrode. Examples of a low refraction index medium include aerogel, porous silica, magnesium fluoride and fluorinated polymers. The refraction index of a transparent substrate is generally from 1.5 to 1.7 and of such a low refraction index medium layer preferably exhibits a refraction index of not more than 1.5, more preferably not more than 1.35.

The layer thickness of a low refraction index medium is desirably not less than two times a wavelength of a light within the medium. This is due to the fact that when the layer thickness of a low refraction index medium reaches the level of a light wavelength, it is also a layer thickness of allowing electromagnetic waves exuded by an evernescent effect to enter the substrate, resulting in reduced effects of the low refractive index layer.

A technique of introducing a diffraction grating to the surface causing total reflection or any one of the mediums is featured in enhancement of light-extraction effect being high. This technique employs a property of diffraction gratings which enables changing the light to a specific direction differing from refraction through primary or secondary refraction, the so-called Bragg refraction. Of lights emitted from a light-emitting layer, a light incapable of exiting due to total reflection between layers is allowed to be diffracted by introducing a diffraction grating between layers or into a medium (within a transparent substrate or a transparent electrode) to extract the light.

An introduced diffraction grating desirably exhibits a two-dimensionally periodic refractive index. Since light generated in the light-emitting layer is emitted at random in all directions, a conventionally one-dimensional diffracting grating allows only a light propagating in a specific direction to be diffracted, resulting in reduced light-extraction efficiency. On the contrary, making a two-dimensional refractive index distribution results in enhanced light-extraction efficiency.

A diffraction grating may be introduced at any location between layers or within a medium (a transparent substrate or a transparent electrode) but preferably near an organic light-emitting layer as a light-generating location. In that case, the periodical length of a diffraction grating is preferably from about ½ to 3 times the wavelength of the light within the medium.

A diffraction grating is repeatedly arranged preferably in a two-dimensional form, such as in a square lattice form, a triangular lattice form or a honeycomb lattice form.

Light-Collecting Sheet

An organic EL device relating to the invention is preferably fabricated to provide a structure of a microlens array form or combined with a light-collecting sheet, whereby light is collected in a specific direction, for example, in the direction of the front face side of the light-emitting face to enhance luminance in a specific direction.

Examples of such a microlens array include square pyramids with a 30 μm edge length and an apex angle of 90 degrees being two-dimensionally arranged on the light-extraction side of the substrate. The edge length is preferably from 10 to 100 μm. An edge length of less than this causes a diffraction effect to form a color. An excessively larger length results in an increased thickness, which is not preferred.

There are usable a light-collecting sheets, for example, practically used in an LED backlight of a liquid crystal display device. Examples of such a sheet include Brightness Enhancement Film (BEF, produced by Sumitomo 3M Co.). A prism sheet form may be one in which triangular stripes of a 90° apex angle are formed at a pitch of 50 μm on the substrate, one of a rounded apex, one in which the pitch is randomly varied or another form.

A light-diffusing plate/film may be used in combination with a light-collecting sheet to control the radiating angle of light from a light-emitting device. There is usable, for example, a diffusion film (light-up) produced by Kimoto Co., Ltd.

Preparation Method of Organic EL Device

Preparation of an Organic EL Device Comprising an anode/hole injection layer/hole transport layer/light-emitting layer/electron transport layer/electron injection layer/cathode will be described as an example of a method for preparing an organic EL device.

First, a thin film comprised of an intended electrode substance, for example, a material for an anode is formed by a method such as vapor deposition or sputtering so as to form a 1 μm or less (preferably 10-200 nm) thick layer on an appropriate substrate to produce an anode.

Next, further thereon are formed organic compound layers of a hole injection layer, a hole transport layer, a light-emitting layer, an electron transport layer, an electron injection layer and a hole blocking layer.

Examples of a methods of forming each of these layers include a vapor deposition method and wet-processes (for example, a spin-coating method, a casting method, an ink-jetting method and a printing method), as described earlier, but in the invention, a coating method such as a spin-coating method, an ink-jetting method or a printing method is preferred in terms of a layer uniformity being more easily obtained and pin-holes less likely to be produced.

Examples of a liquid medium used for dissolution or dispersion of materials for an organic EL material relating to the invention include ketones such as methyl ethyl ketone and cyclohexanone; aliphatic acid esters such as ethyl acetate; halogenated hydrocarbons such as dichlorobenzene; aromatic hydrocarbons such as toluene, xylene, mesitylene and cyclohexylbenzene; aliphatic hydrocarbons such as cyclohexane, decalin and dodecane; and organic solvents such as DMF and DMSO. Dispersion can be performed by a dispersing method such as ultrasonic, a high shearing force dispersion or a media dispersion.

After formation of these layers, further thereon, a thin film comprised of a material for a cathode is formed by a method such as vapor deposition or sputtering so as to form a 1 μm or less (preferably 50-200 nm) thick layer to produce a cathode, whereby a desired organic EL device is prepared.

Alternatively, the order of producing the respective layers may be reversed and layer formation is feasible in the order of a cathode, an electron injection layer, an electron transport layer, a light-emitting layer, a hole transport layer, a hole injection layer and an anode. When applying a dc voltage to the thus obtained multi-color display device, an electric voltage of 2-40 V is applied to an anode of a positive polarity and a cathode of negative polarity, whereby light emission is observed. An ac voltage may be applied at a any waveform.

Use

An organic EL device relating to the invention is usable as a display device, a display and various kinds of light sources. Examples of light sources include light sources for lighting devices (e.g., home lighting, in-vehicle lighting), a backlight used for a watch or a liquid crystal, a light source for an advertising display, a signal and a photo storage medium, light sources for electrophotographic copiers, a light source for an optical communication device and a light source for a optical sensor but are by no means limited to these.

An organic EL device relating to the invention may optionally be subjected to a patterning treatment by metal-masking or ink-jet printing in the course of film formation. When subjected to patterning, only the electrode may be subjected to patterning, or all layers of the device may be subjected to patterning, in which conventional methods are applicable to preparation of the device.

The luminescencing color of an organic EL device relating to the invention and a compound relating to the invention can be determined based on the color obtained by applying a color measured withy a spectroscopic radiation illuminance meter (CS-1000, produced by Konica Minolta Sensing Inc.) to CIE chromaticity coordinate, as described in "Shinpen Shikisai Kagaku Handbook" (New Edition Color Science Handbook) edited by Nippon Shikisai-Gakkai, published by Tokyo Univ. Shuppankai, 1985, p. 108, FIG. 4-16.

When an organic EL device relating to the invention is a white-emitting device, "white" refers to that a chromaticity at 1000 Cd/m$^2$ in CIE 1931 Color Specification System falls within a region of X=0.33±0.07 and Y=0.33±0.1 when a front illuminance at a visual field angle of 2 degrees is measured by the method described above.

EXAMPLES

The present invention will be further described with reference to examples but embodiments of the invention are by no means limited to these.

The structures of compounds used in examples are shown below.

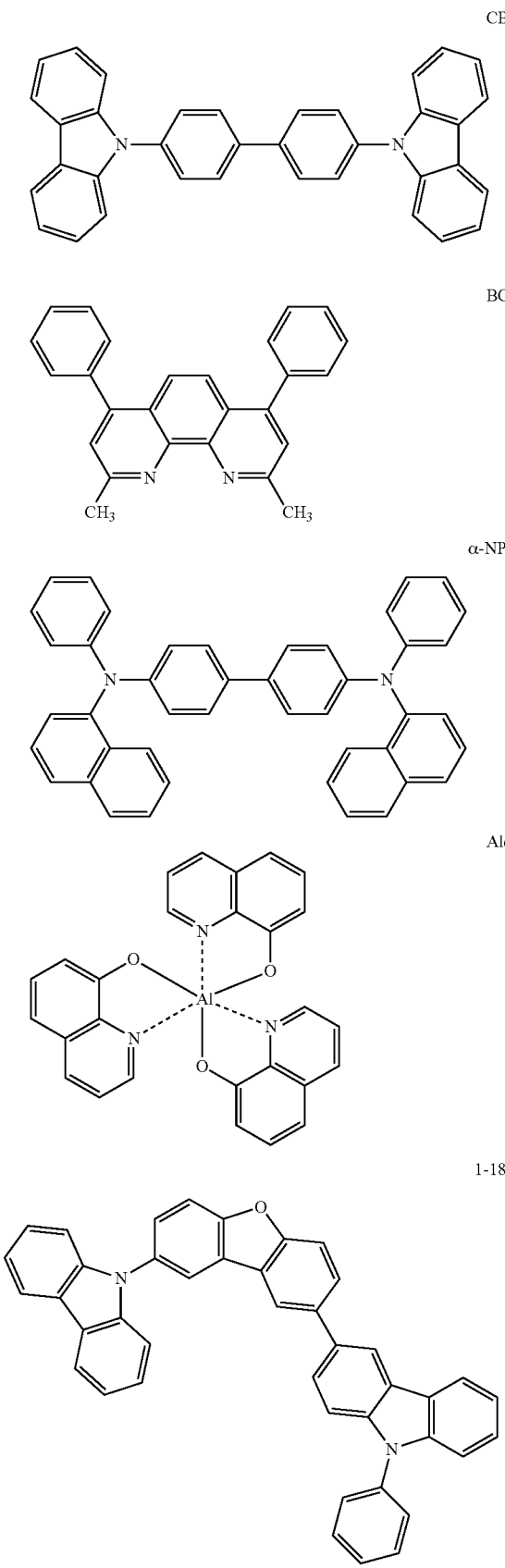

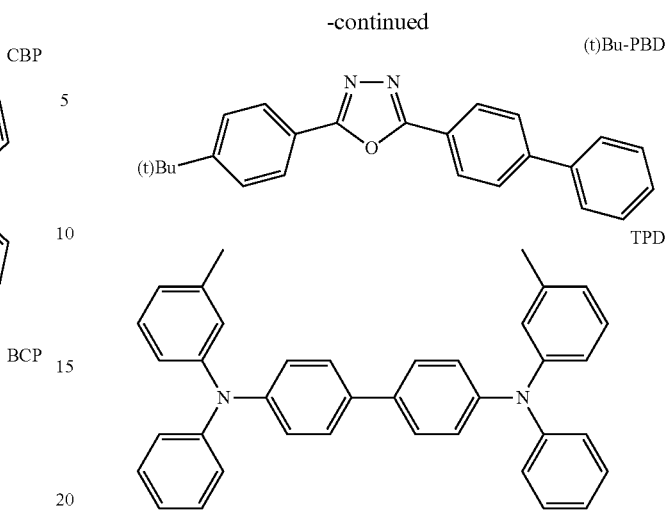

Example 1

Preparation of Organic EL Device A-1

A substrate as an anode (NA45, produced by NH Technoglass Co.) obtained by forming a 100 nm thick ITTO (indium oxide) layer on a 100 mm×100 mm×1.1 mm glass substrate was subjected to patterning. The transparent support substrate provided with an ITO transparent electrode was subjected to ultrasonic-washing in isopropyl alcohol, dried in dry nitrogen gas and further subjected to UV ozone washing for 5 min. The transparent support substrate was secured onto a substrate holder of a commercially available vacuum deposition apparatus. Meanwhile, 200 mg of exemplified compound 4-8 was placed into a molybdenum resistance heating boat, 200 mg of CBP as a host compound was placed into another molybdenum resistance heating boat, 200 mg of basocuproin (BCP) was placed into yet another molybdenum resistance heating boat, 100 mg of Ir-1 was placed into yet another molybdenum resistance heating boat and further, 200 mg of Alq$_3$ was placed into yet another molybdenum resistance heating boat, each of which was fitted into the vacuum deposition apparatus.

Subsequently, a vacuum vessel was evacuated to $4\times10^{-4}$ Pa and the heating boat having compound 4-8 was heated with applying electric current thereto and compound 4-8 was deposited on the transparent support substrate at a deposition rate of 0.1 nm/sec to form a 40 nm thick hole transport layer.

Further, the heating boats having CBP and Ir-1 were each heated with applying electric current thereto and CBP and Ir-1 were each deposited on the hole transport layer at a deposition rate of 0.2 nm/sec and 0.012 nm/sec, respectively, to form a 40 nm thick light-emitting layer. The substrate temperature during deposition was room temperature.

Further, the heating boat having BCP was heated with applying electric current thereto and BCP was deposited on the light-emitting layer at a deposition rate of 0.1 nm/sec to form a 10 nm thick hole blocking layer.

Further, the heating boat having Alq$_3$ was heated with applying electric current thereto and Alq$_3$ was deposited on the light-emitting layer at a deposition rate of 0.1 nm/sec to form a 40 nm thick electron transport layer. The substrate temperature during deposition was room temperature.

Subsequently, further thereon, a 0.5 nm thick lithium fluoride and a 110 nm thick aluminum were each deposited to form a cathode. Organic EL device A-1 was thus prepared.

Analysis of Reduction in Concentration of Organic Compound

The thus obtained organic EL device A-1 was analyzed with respect to a reduction of concentration of compound 4-8, as a reactive organic compound, after application of an electric current, as follows.

A constant current of 2.5 mA/cm$^2$ was applied to organic EL device A-1 under a dry nitrogen gas atmosphere at 23° C. over 1,000 hr., which was denoted as A-2, and a constant current was also applied to A-1 under the same condition over 4,000 hr., which was denoted as A-3.

The concentration of compound 4-8 contained in the hole transport layer of each of organic EL devices A-1, A-2 and A-3 was determined by measurement of the distribution of the vinyl group of compound 4-8. The distribution of a double bond of a vinyl group was measured according to the following manner.

To secure an area for analysis, organic EL device samples A-1 to A-3 each were obliquely cut by using SAICAS Type NN04, produced by DAIPLA WINTES CO., LTD. Cutting was done at 500 power magnification to obtain a 20 μm wide analysis area of a hole transport layer. Subsequently, with respect to the cutting surface, double bonds remaining in the hole transport layer were labeled by the bromine addition method. The thus labeled samples were each measured by Quantera SXM, produced by ULVAC-PHI Inc. with respect to elemental composition distribution on the cut surface to determine n elemental composition distribution on the cut surface. The measurement results are shown, below.

| Organic EL Device | Current-Application Time | C (Carbon atom) | Br (Bromine atom) | N (Nitrogen atom) |
|---|---|---|---|---|
| A-1*[1] | 0 | 80.19 | 15.91 | 3.90 |
| A-2*[2] | 1000 | 80.96 | 10.92 | 4.12 |
| A-3*[2] | 4000 | 90.06 | 5.58 | 4.36 |

*[1]: before current application
*[2]: after current application

As can be seen from the measurement results, it was proved that a remaining compound 4-8 amount in the hole transport layer apparently decreased with current application time, indicating occurrence of polymerization or cross-linking reaction of compound 4-8 during current application.

Further, it was confirmed that similarly to compound 4-8 of Example 1, reactive organic compounds in organic EL devices of Example 2 or later also caused a reduction of their concentrations.

Example 2

Preparation of Organic EL Device 1-1

A substrate, as an anode (NA45, produced by NH Technoglass Co.) obtained by forming a 100 nm thick ITTO (indium oxide) layer on a 100 mm×100 mm×1.1 mm glass substrate was subjected to patterning. The transparent support substrate provided with an ITO transparent electrode was subjected to ultrasonic-washing in isopropyl alcohol, dried in dry nitrogen gas and further subjected to UV ozone washing for 5 min. The transparent support substrate was fixed on a substrate holder of a commercially available vacuum deposition apparatus.

Meanwhile, 200 mg of α-NPD was placed into a molybdenum resistance heating boat, 200 mg of CBP as a host compound was placed into a different molybdenum resistance heating boat, 200 mg of basocuproin (BCP) was placed into a different molybdenum resistance heating boat, 100 mg of Ir-1 was placed into a different molybdenum resistance heating boat and further, 200 mg of Alq$_3$ was placed into a different molybdenum resistance heating boat, each of which was placed into the vacuum deposition apparatus.

Subsequently, a vacuum vessel was evacuated to 4×10$^{-4}$ Pa and the heating boat having α-NPD was heated with applying electric current thereto and compound 4-8 was deposited on the transparent support substrate at a deposition rate of 0.1 nm/sec to form a 40 nm thick hole transport layer.

Further, the heating boats having CBP and Ir-1 were each heated with applying electric current thereto and CBP and Ir-1 were each deposited on the hole transport layer at a deposition rate of 0.2 nm/sec and 0.012 nm/sec, respectively, to form a 40 nm thick light-emitting layer. The substrate temperature during deposition was room temperature.

Further, the heating boat having BCP was heated with applying electric current thereto and BCP was deposited on the light-emitting layer at a deposition rate of 0.1 nm/sec to form a 10 nm thick hole blocking layer.

Further, the heating boat having Alq$_3$ was heated with applying electric current thereto and Alq$_3$ was deposited on the light-emitting layer at a deposition rate of 0.1 nm/sec to form a 40 nm thick electron transport layer. The substrate temperature during deposition was room temperature.

Subsequently, further thereon, a 0.5 nm thick lithium fluoride and a 110 nm thick aluminum were each deposited to form a cathode. Organic EL device A-1 was thus prepared.

Preparation of Organic EL Device 1-2 to 1-5

Organic EL devices 1-2 to 1-5 were each prepared similarly to organic EL device 1-1, except that CBP and Ir-1 of the light-emitting layer were replaced by a compound shown in Table 1.

Evaluation of Organic EL Device 1-1 to 1-5

Organic EL devices 1-1 to 1-5 were each evaluated in the following manner and the results thereof are shown in Table 1.

External Extraction Quantum Efficiency

The thus prepared organic EL devices were each measured with respect to external extraction quantum efficiency (%) when applying a constant current of 2.5 mA/cm$^3$ under dry nitrogen gas atmosphere. Measurement was conducted using a spectroscopic radiation illuminance meter (CS-1000, produced by Konica Minolta Sensing Inc.).

The measurement results of external extraction quantum efficiency, shown in Table 1 were represented by relative values, based on the measured value of organic EL device 1-1 being 100.

Lifetime

When driven at a constant current of 2.5 mA/cm$^2$, a time necessary to reach a half of the luminance immediately after initiating light emission (initial luminance) was measured, which was designated as a half-lifetime ($\tau_{0.5}$) as a measure of lifetime. Measurement was conducted by using a spectroscopic radiation illuminance meter (CS-1000, produced by Konica Minolta Sensing Inc.).

The thus obtained results are shown in Table 1. Lifetimes in Table 1 were represented by relative values, based on the value of organic EL device 1-1 being 100.

TABLE 1

| Organic EL Device | Compound | | External Extraction Quantum Efficiency | Lifetime | Remark |
|---|---|---|---|---|---|
| 1-1 | CBP | Ir-1 | 100 | 100 | Comp. |
| 1-2 | 1-1 | Ir-1 | 105 | 198 | Inv. |
| 1-3 | 1-1 | 2-1 | 108 | 332 | Inv. |
| 1-4 | 1-2 | Ir-1 | 110 | 240 | Inv. |
| 1-5 | 1-2 | 2-1 | 112 | 382 | Inv. |

As shown in Table 1, it was proved that organic EL devices of the invention which were provided with an organic layer containing a reactive organic compound achieved enhanced external extraction quantum efficiency and a longer lifetime.

Example 3

Preparation of Organic EL Device 2-1 to 2-5

Organic EL device 2-1 was prepared similarly to organic EL device 1-1, except that Ir-1 was replaced by Ir-9. Further, organic EL devices 2-2 to 2-5 were prepared similarly to organic EL device 1-2, except that compounds 1-1 and Ir-1 were replaced by compounds shown in Table 2.

The thus obtained devices were each evaluated similarly to Example 2 and results thereof are shown in Table 2.

TABLE 2

| Organic EL Device | Compound | | External Extraction Quantum Efficiency | Lifetime | Remark |
|---|---|---|---|---|---|
| 2-1 | CBP | Ir-9 | 100 | 100 | Comp. |
| 2-2 | 1-1 | Ir-9 | 109 | 210 | Inv. |
| 2-3 | 1-1 | 2-5 | 115 | 288 | Inv. |
| 2-4 | 1-2 | Ir-9 | 113 | 231 | Inv. |
| 2-5 | 1-2 | 2-5 | 119 | 329 | Inv. |

As shown in Table 2, it was proved that organic EL devices of the invention which were provided with an organic layer containing a reactive organic compound achieved enhanced external extraction quantum efficiency and a long lifetime.

Example 4

Preparation of Organic EL Device 3-1 to 3-5

Organic EL device 3-1 was prepared similarly to organic EL device 1-1, except that Ir-1 was replaced by Ir-12. Further, organic EL devices 3-2 to 3-5 were each prepared similarly to organic EL device 1-2, except that compounds 1-1 and Ir-1 were replaced by compounds shown in Table 2.

The thus obtained devices were each evaluated similarly to Example 2 and results thereof are shown in Table 3.

TABLE 3

| Organic EL Device | Compound | | External Extraction Quantum Efficiency | Lifetime | Remark |
|---|---|---|---|---|---|
| 3-1 | CBP | Ir-12 | 100 | 100 | Comp. |
| 3-2 | 1-1 | Ir-12 | 105 | 241 | Inv. |
| 3-3 | 1-1 | 2-9 | 106 | 332 | Inv. |
| 3-4 | 1-2 | Ir-12 | 105 | 281 | Inv. |
| 3-5 | 1-2 | 2-9 | 109 | 372 | Inv. |

As shown in Table 2, it was proved that organic EL devices of the invention which were provided with an organic layer containing a reactive organic compound achieved enhanced external extraction quantum efficiency and a long lifetime.

Example 5

Preparation of Organic EL Device 4-1 to 4-3

Organic EL device 4-1 to 4-3 were each prepared similarly to organic EL device 3-1, except that compounds were replaced by those shown in Table 4.

The thus obtained devices were each evaluated similarly to Example 2 and results thereof are shown in Table 4.

TABLE 4

| Organic EL Device | Compound | | External Extraction Quantum Efficiency | Lifetime | Remark |
|---|---|---|---|---|---|
| 4-1 | 1-18H | Ir-15 | 100 | 100 | Comp. |
| 4-2 | 1-18 | Ir-15 | 102 | 202 | Inv. |
| 4-3 | 1-18 | 2-18 | 104 | 230 | Inv. |

As shown in Table 4, it was proved that organic EL devices of the invention which were provided with an organic layer containing a reactive organic compound achieved enhanced external extraction quantum efficiency and a long lifetime.

Example 6

Preparation of Organic EL Device 5-1

A substrate, as an anode (NA45, produced by NH Technoglass Co.) obtained by forming a 100 nm thick ITTO (indium oxide) layer on a 100 mm×100 mm×1.1 mm glass substrate was subjected to patterning. The transparent support substrate provided with an ITO transparent electrode was subjected to ultrasonic-washing in isopropyl alcohol, dried in dry nitrogen gas and further subjected to UV ozone washing for 5 min.

The substrate was placed onto a commercially available spin coater. A solution of exemplified compound 4-1 (60 mg) dissolved in 100 ml toluene was spin-coated at 1000 rpm over 30 sec. (layer thickness of approximately 40 nm), exposed to ultraviolet rays for 30 sec. and dried in vacuo at 60° C. for 1 hr. to form a hole transport layer.

Subsequently, a solution of exemplified compound 1-2 (60 mg) and compound 2-7 (3.0 mg) dissolved in 6 ml toluene was spin-coated at 1000 rpm over 30 sec. (layer thickness of approximately 60 nm), exposed ultraviolet rays for 30 sec. and dried in vacuo at 60° C. for 1 hr. to form a light-emitting layer.

Further, a solution of exemplified compound 3-1 (20 mg) dissolved in 10 ml toluene was spin-coated at 1000 rpm over 30 sec. (layer thickness of approximately 10 nm), exposed ultraviolet rays for 30 sec. and dried at 60° C. for 1 hr. to form a hole blocking layer.

The thus produced substrate was fixed onto a substrate holder of a vacuum deposition apparatus and 200 mg of Alq$_3$ was placed into a molybdenum resistance heating boat, which was placed into the vacuum deposition apparatus. Subsequently, after evacuating a vacuum vessel to $4 \times 10^{-4}$ Pa, the heating boat having Alq$_3$ was heated with applying electric current thereto and Alq$_3$ was deposited on the hole blocking layer at a deposition rate of 0.1 nm/sec to form a 40 nm thick electron transport layer.

The substrate temperature during deposition was room temperature.

Subsequently, lithium fluoride and aluminum were deposited at thicknesses of 0.5 nm and 110 nm, respectively, to form a cathode. Organic EL device 5-1 was thus prepared.

When the device was driven at a constant current, luminescence at 2000 cd/m² was observed.

Even when exemplified compound 4-1 was replaced by compound 4-7 or 4-10, exemplified compound 1-2 was replaced by compound 1-3 or 1-5, and exemplified compound 3-1 was replaced by compound 3-6 or 3-9, luminescence was also observed.

For comparison, although preparation of an organic EL device was attempted by replacing exemplified compound 4-1 by compound α-NPD, replacing exemplified compound 1-2 by compound CBP, replacing exemplified compound 2-7 by compound Ir-1 or replacing exemplified compound 3-1 by compound BCP, no organic EL device was formed.

Example 7

Preparation of Organic EL Full-Color Display Device

FIGS. 1(a) through 1(e) illustrate constitution of an organic EL display device. A substrate as an anode (NA45, produced by NH Technoglass Co.) obtained by forming a 100 nm thick ITTO layer (102) on a glass substrate (101) was subjected to patterning at a pitch of 100 μm. A polyimide barrier 103 (width: 20 μm, thickness: 2.0 μm) was formed between ITO transparent electrodes on the glass substrate by means of photolithography. A composition for a hole injection layer, as described below was injected between these polyimide barriers on the ITO electrode by using an ink-jet head (MJ 800C, produced by Seiko Epson Corp.), exposed to ultraviolet rays for 30 sec. and dried at 60° C. for 10 min. to form a hole injection layer 104.

Further, a blue-light-emitting layer composition, a green-light-emitting layer composition and a red-light-emitting layer composition, as described below were each ejected onto the hole injection layer, similarly by using an ink-jet head, exposed to ultraviolet rays for 30 sec. and dried at 60° C. for 10 min. to form light-emitting layers (105B, 105G, 105R). Finally, aluminum as a cathode (106) was vacuum-deposited to cover the light-emitting layers, whereby an organic EL device was prepared.

It was proved that the thus prepared organic EL device emitted blue, green and red lights by applying a voltage to the individual electrodes and was usable as a full-color display device.

| Hole injection layer composition | |
|---|---|
| Compound 4-8 | 20 parts by mass |
| Cyclohexylbenzene | 50 parts by mass |
| Isopropyl biphenyl | 50 parts by mass |
| Blue-emitting layer composition | |
| Compound 1-2 | 0.7 parts by mass |
| Ir-12 | 0.04 parts by mass |
| Cyclohexylbenzene | 50 parts by mass |
| Isopropyl biphenyl | 50 parts by mass |
| Green-emitting layer composition | |
| Compound 1-2 | 0.7 parts by mass |
| Ir-1 | 0.04 parts by mass |
| Cyclohexylbenzene | 50 parts by mass |
| Isopropyl biphenyl | 50 parts by mass |
| Red-emitting layer composition | |
| Compound 1-2 | 0.7 parts by mass |
| Ir-9 | 0.04 parts by mass |

-continued

| | |
|---|---|
| Cyclohexylbenzene | 50 parts by mass |
| Isopropyl biphenyl | 50 parts by mass |

Further, it was proved that organic EL devices prepared by replacing Ir-1, Ir-12 and Ir-9 by compounds 2-1 to 2-10, by replacing compound 1-2 by compound 1-1 or any one of compounds 1-3 to 1-10, were usable as a full-color display device.

Example 8

Preparation of Organic EL Device 6-1

A substrate, as an anode (NA45, produced by NH Technoglass Co.) obtained by forming a 100 nm thick ITTO (indium oxide) layer on a 100 mm×100 mm×1.1 mm glass substrate was subjected to patterning. The transparent support substrate provided with an ITO transparent electrode was subjected to ultrasonic-washing in isopropyl alcohol, dried in dry nitrogen gas and further subjected to UV ozone washing for 5 min. The substrate was placed onto a commercially available spin coater. A solution of exemplified compound 4-8 (60 mg) dissolved in 100 ml toluene was spin-coated at 1000 rpm over 30 sec. (layer thickness of approximately 40 nm), exposed ultraviolet rays for 30 sec. and dried in vacuo at 60° C. for 1 hr. to form a hole transport layer.

Subsequently, a solution of exemplified compound 1-2 (60 mg), compound 2-5 (3.0 mg) and compound 2-7 (3.0 mg) dissolved in 6 ml toluene was spin-coated at 1000 rpm over 30 sec. (layer thickness of approximately 40 nm), exposed ultraviolet rays for 30 sec. and dried in vacuo at 60° C. for 1 hr. to form a light-emitting layer.

Further, a solution of exemplified compound 3-1 (20 mg) dissolved in 6 ml toluene was spin-coated at 1000 rpm over 30 sec. (layer thickness of approximately 10 nm), exposed ultraviolet rays for 30 sec. and dried at 60° C. for 1 hr. to form a hole blocking layer.

The thus produced substrate was fixed onto a substrate holder of a vacuum deposition apparatus and 200 mg of Alq₃ was placed into a molybdenum resistance heating boat and put into the vacuum deposition apparatus. After evacuating a vacuum vessel to 4×10⁻⁴ Pa, the heating boat having Alq₃ was heated with applying electric current thereto and Alq₃ was deposited on the hole blocking layer at a deposition rate of 0.1 nm/sec to form a 40 nm thick electron transport layer. The substrate temperature during deposition was room temperature.

Subsequently, lithium fluoride and aluminum were deposited at thicknesses of 0.5 nm and 110 nm, respectively, to form a cathode. Organic EL device 6-1 was thus prepared.

Application of current to the device obtained light close to white, which was proved to be used as a lighting device. It was further proved that even when replaced by other compounds, white emission was obtained.

Example 9

Preparation of Organic EL Device 1

A substrate, as an anode (NA45, produced by NH Technoglass Co.) obtained by forming a 100 nm thick ITTO (indium oxide) layer on a 100 mm×100 mm×1.1 mm glass substrate was subjected to patterning. Then, the transparent support substrate provided with an ITO transparent electrode was subjected to ultrasonic-washing in isopropyl alcohol, dried in dry nitrogen gas and further subjected to UV ozone washing for 5 min.

A solution in which poly(3,4-ethylenedixythiophene)-polystyrene sulfonate (PEDOT/PSS), Baytron P Al 4083 (produced by Bayer Co.) was coated was diluted to 70% with pure water, was coated onto the foregoing transparent support substrate by a spin coat method at 3000 rpm for 30 sec. and dried at 200° C. for 1 hr. to form a 30 nm thick hole transport layer.

The substrate was moved into a nitrogen atmosphere and further thereon, a solution of 20 mg of a reactive organic compound 4-11 dissolved in 5 ml toluene was coated by the spin coat method at 2000 rpm for 30 sec. to form a layer and then exposed to UV (100 WW, UVA) for 10 sec. to perform photopolymerization/cross-linking so that unreacted compound 4-11 remained, whereby a 30 nm thick second hole transport layer was formed. The amount (or concentration) of a reactive organic compound 4-11 remained in the layer was determined by the method described later.

Onto the second hole transport layer was coated a solution of 30 mg of tBu-PBD and 1.5 mg of Ir-1 dissolved in 3 ml of dichlorobenzene by the spin coat method at 2000 rpm for 30 sec and dried in vacuo for 1 hr. to form a 50 nm thick light-emitting layer.

This was placed into a vacuum deposition apparatus and after evacuating a vacuum vessel to $4 \times 10^{-4}$ Pa, calcium as a cathode buffer layer and aluminum as a cathode were each deposited at thicknesses of 10 nm and 110 nm, respectively, whereby organic EL device 1 was prepared.

Measurement of Tg Variation

A constant current of 2.5 mA/cm² was applied to the organic EL device 1 under a dry nitrogen gas atmosphere at 23° C., and the device at the time when a luminance decreased by 10% from the initial luminance (or 90% of the initial luminance) was designated "device 1(90)" and the device at the time when a luminance decreased by 50% from the initial luminance (or 50% of the initial luminance) was designated "device 1(50)". The Tg (glass transition point) of the hole transport layer was measured in the following manner. To secure an area for analysis, organic EL device sample was obliquely cut by using SAICAS Type NN04, produced by DAIPLA WINTES CO., LTD. Cutting was done at 500 power magnification to obtain a 20 μm wide analysis area of a hole transport layer.

Subsequently, a Tg of the hole transport region was measured by an atomic force microscope in combination with a thermal probe as a heater and a detector.

Numerical values shown in Table 5 are defined as below.

Tg(90%): a glass transition point of a hole transport layer at the time when reached 90% of the initial luminance, Tg(50%): a glass transition point of a hole transport layer at the time when reached 50% of the initial luminance, Tg(initial): a glass transition point of a device before applying current, $\Delta Tg(90\%)=[Tg(90\%)/Tg(\text{initial})]$ $\Delta Tg(50\%)=[Tg(50\%)/Tg(\text{initial})]$ Organic EL Device 2

Organic EL device 2 was prepared in the same manner as the organic EL device 1. Similarly to the organic EL device 1, the device at the time when a luminance decreased by 10% from the initial luminance was designated "device 2(90)" and its residual reactive organic compound amount was determined, then, the residual reactive organic compound was allowed to disappear upon exposure to UV for 60 sec.

A constant current of 2.5 mA/cm² was applied to this device, the device at the time when a luminance decreased by 50% from the initial luminance was designated "device 2(90)" and its residual reactive organic compound amount was determined.

Organic EL Device 3

A substrate, as an anode (NA45, produced by NH Technoglass Co.) obtained by forming a 100 nm thick ITTO (indium oxide) layer on a 100 mm×100 mm×1.1 mm glass substrate was subjected to patterning. Then, the transparent support substrate provided with an ITO transparent electrode was subjected to ultrasonic-washing in isopropyl alcohol, dried in dry nitrogen gas and further subjected to UV ozone washing for 5 min.

A solution in which poly(3,4-ethylenedixythiophene)-polystyrene sulfonate (PEDOT/PSS), Baytron P Al 4083 (produced by Bayer Co.) was diluted to 70% with pure water, was coated onto the foregoing transparent support substrate by a spin coat method at 3000 rpm for 30 sec. and dried at 200° C. for 1 hr. to form a 30 nm thick hole transport layer.

This substrate was placed into a vacuum deposition apparatus and after evacuating a vacuum vessel to $4 \times 10^{-4}$ Ps, TPD was deposited on the hole transport layer to form a 30 nm thick second hole transport layer. Then, tBu-PBD and Ir-1 were co-deposited onto the second hole transport layer so that Ir-1 was doped in an amount of 6% by mass of tBu-PBD, whereby a 50 nm thick light-emitting layer was formed.

Further, calcium as a cathode buffer layer and aluminum as a cathode were each deposited at thicknesses of 10 nm and 110 nm, respectively, whereby organic EL device 3 was formed.

Similarly to the organic EL device 1, the device at the time when a luminance decreased by 10% or 50% from the initial luminance was designated "device 3(90)" or "device 3(50)", respectively, and the residual reactive organic compound amount thereof was determined.

Organic EL Device 4

Organic EL device 4 was prepared similarly to the foregoing organic EL device 1, except that the UV exposure time to form the second hole transport layer was changed to 90 sec.

Similarly to the organic EL device 1, the device at the time when a luminance decreased by 10% or 50% from the initial luminance was designated "device 4(90)" or "device 4(50)", respectively, and the residual reactive organic compound amount thereof was determined.

The ΔTg(90%) and ΔTg(50%) of devices 2-4 were determined similarly to the device 1. Results thereof are shown in Table 5.

Lifetime of Organic EL Device 1-5

When driven at a constant current of 2.5 mA/cm², a time necessary to reach a half of the luminance immediately after initiating light emission (initial luminance) was measured, which was designated a half-lifetime ($\tau_{0.5}$) as a measure of lifetime. Measurement was conducted by using a spectroscopic radiation illuminance meter (CS-1000, produced by Konica Minolta Sensing Inc.). Lifetimes in Table 5 are represented by relative values, based on the value of organic EL device 4 being 100.

TABLE 5

| Device | Tg (° C.) ΔTg90 | ΔTg50 | Tg50/Tg90 | Lifetime (%) | Remark |
|---|---|---|---|---|---|
| Device 1 | 1.040 | 1.060 | 1.019 | 800 | Inv. |
| Device 2 | 1.040 | 1.150 | 1.106 | 350 | Inv. |
| Device 3 | 1.000 | 1.000 | 1.000 | 20 | Comp. |
| Device 4 | 1.000 | 0.999 | 0.990 | 100 | Comp. |

As is apparent from Table 5, it was proved that devices exhibiting an increase in Tg with time (in other words, development of reconstruction of the layer along with network formation) resulted in enhanced lifetime.

Example 10

Organic EL Device 5

A substrate, as an anode (NA45, produced by NH Technoglass Co.) obtained by forming a 100 nm thick ITTO (indium oxide) layer on a 100 mm×100 mm×1.1 mm glass substrate was subjected to patterning. Then, the transparent support substrate provided with an ITO transparent electrode was subjected to ultrasonic-washing in isopropyl alcohol, dried in dry nitrogen gas and further subjected to UV ozone washing for 5 min.

A solution in which poly(3,4-ethylenedixythiophene)-polystyrene sulfonate (PEDOT/PSS), Baytron P Al 4083 (produced by Bayer Co.) was coated was diluted to 70% with pure water, was coated onto the foregoing transparent support substrate by a spin coat method at 3000 rpm for 30 sec. and dried at 200° C. for 1 hr. to form a 30 nm thick hole transport layer.

The substrate was moved into a nitrogen atmosphere and further thereon, a solution of 20 mg of a reactive organic compound 4-11 dissolved in 5 ml toluene was coated by the spin coat method at 2000 rpm for 30 sec. to form a layer and then exposed to UV (100 WW, UVA) for 15 sec. to perform photopolymerization/cross-linking so that unreacted compound 4-11 remained, whereby a 30 nm thick second hole transport layer was formed.

Onto the second hole transport layer, a solution of 30 mg of compound 1-2 and 1.5 mg of compound 2-2 dissolved in 3 ml of toluene was coated by the spin coat method at 2000 rpm for 30 sec, subjected to UV exposure for 15 sec. (100 W, UVA) and dried at 100° C. for 10 min. to form a 50 nm thick light-emitting layer.

Further, a solution of 10 mg of compound 3-11 dissolved in 3 ml of toluene was coated by the spin coat method at 500 rpm over 30 sec, subjected to UV exposure for 30 sec. (100 W, WA) to form a 25 nm thick electron transfer layer.

This was placed into a vacuum deposition apparatus and after evacuating a vacuum vessel to 4×10$^{-4}$ Ps, calcium as a cathode buffer layer and aluminum as a cathode were each deposited at thicknesses of 1.0 nm and 110 nm, respectively, whereby organic EL device 5. The concentration of reactive organic compound was determined similarly to the organic EL device 1.

Organic EL Device

An organic EL device 6 was prepared similarly to the foregoing organic EL device 5, except that in the formation of a second hole transport layer, a light-emitting layer and an electron transport layer, the exposure time to UV was changed to 60 sec. The concentration of a reactive organic compound was determined similarly to the organic EL device 5.

Each of the second hole transport layer, light-emitting layer and electron transport layer of the thus obtained organic EL devices 5 and 6 was measured with respect to a glass transition point before initiation of electric current application, at the time of 90% of the initial luminance or at the time of 50% of the initial luminance. Obtained results are shown in Table 6.

TABLE 6

| Device | Hole Transport Layer | | | Light-emitting Layer | | | Electron Transport Layer | | | Lifetime (%) | Remark |
|---|---|---|---|---|---|---|---|---|---|---|---|
| | ΔTg90 | ΔTg50 | ΔTg50/ΔTg90 | ΔTg90 | ΔTg50 | ΔTg50/ΔTg90 | ΔTg90 | ΔTg50 | ΔTg50/ΔTg90 | | |
| Device 5 | 1.040 | 1.060 | 1.019 | 1.010 | 1.060 | 1.050 | 1.030 | 1.040 | 1.010 | 800 | Inv. |
| Device 6 | 0.000 | 0.999 | 0.990 | 0.000 | 0.000 | 0.000 | 0.000 | 0.000 | 0.000 | 100 | Comp. |

As is apparent from Table 6, it was proved that, similarly to Example 9, the devices of the invention which exhibited an increase in Tg with time (in other words, development of reconstruction of the layer along with network formation) resulted in enhanced lifetime, even in the case of being multilayered.

Example 11

Preparation of Organic EL Full-Color Display Device

FIGS. 1(a) through 1(e) illustrate constitution of an organic EL display device. A substrate as an anode (NA45, produced by NH Technoglass Co.) obtained by forming a 100 nm thick ITTO film (102) on a glass substrate (101) was subjected to patterning at a pitch of 100 μm. A polyimide barrier 103 (width: 20 μm, thickness: 2.0 μm) was formed between ITO transparent electrodes on the glass substrate by means of photolithography. A composition for a hole injection layer, as described below was injected between these polyimide barriers on the ITO electrode by using an ink-jet head (MJ 800C, produced by Seiko Epson Corp.), exposed to ultraviolet rays for 30 sec. and dried at 60° C. for 10 min. to form a hole injection layer 104.

Further, a blue-light-emitting layer composition, a green-light-emitting layer composition and a red-light-emitting layer composition, as described below were each ejected onto the hole injection layer, similarly by using an ink-jet head, exposed to ultraviolet rays for 30 sec. and dried at 60° C. for 10 min. to form light-emitting layers (105B, 105G, 105R). Finally, Aluminum as a cathode (106) was vacuum-deposited to cover the light-emitting layers, whereby an organic EL device was prepared.

It was proved that the thus prepared organic EL device emitted blue, green and red lights by applying a voltage to the individual electrodes and was usable as a full-color display device.

| Hole injection layer composition | |
| --- | --- |
| Compound 4-11 | 20 parts by mass |
| Cyclohexylbenzene | 50 parts by mass |
| Isopropyl biphenyl | 50 parts by mass |
| Blue-emitting layer composition | |
| Compound 3-11 | 0.7 parts by mass |
| Compound 2-9 | 0.04 parts by mass |
| Cyclohexylbenzene | 50 parts by mass |
| Isopropyl biphenyl | 50 parts by mass |
| Green-emitting layer composition | |
| Compound 3-11 | 0.7 parts by mass |
| Compound 2-2 | 0.04 parts by mass |
| Cyclohexylbenzene | 50 parts by mass |
| Isopropyl biphenyl | 50 parts by mass |
| Red-emitting layer composition | |
| Compound 3-11 | 0.7 parts by mass |
| Compound 2-5 | 0.04 parts by mass |
| Cyclohexylbenzene | 50 parts by mass |
| Isopropyl biphenyl | 50 parts by mass |

Example 12

Preparation of Organic EL White-Lighting Device

A white-emitting organic EL device 6W (white) was prepared similarly to the organic EL device of Example 10, except that compound 2-2 used for the luminescence composition was changed to a mixture of compounds 2-2, 2-5 and 2-9. To evaluate the thus prepared organic EL device 6W, the non-light-emitting surface of the device was covered with a glass case to prepare a lighting device. The lighting device was usable as a flat panel lighting device emitting white light with enhanced light-emitting efficiency and long-lived emission.

Example 13

Preparation of Organic EL Device 1

A substrate, as an anode (NA45, produced by NH Technoglass Co.) obtained by forming a 100 nm thick ITTO (indium oxide) layer on a 100 mm×100 mm×1.1 mm glass substrate was subjected to patterning. Then, the transparent support substrate provided with an ITO transparent electrode was subjected to ultrasonic-washing in isopropyl alcohol, dried in dry nitrogen gas and further subjected to UV ozone washing for 5 min.

A solution in which poly(3,4-ethylenedixythiophene)-polystyrene sulfonate (PEDOT/PSS), Baytron P Al 4083 (produced by Bayer Co.) was coated was diluted to 70% with pure water, was coated onto the foregoing transparent support substrate by a spin coat method at 3000 rpm for 30 sec. and dried at 200° C. for 1 hr. to form a 30 nm thick hole transport layer.

The substrate was moved into a nitrogen atmosphere and further thereon, a solution of 20 mg of a reactive organic compound 4-11 dissolved in 5 ml toluene was coated by the spin coat method at 2000 rpm for 30 sec. to form a layer and then exposed to UV (100 WW, UVA) for 15 sec. to perform photopolymerization/cross-linking so that unreacted compound 4-11 remained, whereby a 30 nm thick second hole transport layer was formed. The amount of unreacted compound 4-11 was determined according to the analytical method described later.

On the second hole transport layer, a solution of 30 mg of tBu-PBD and 1.5 mg of Ir-1 dissolved in 3 ml of dichlorobenzene, was spin-coated at 2000 rpm over 30 sec. and dried in vacuo at 60° C. for 1 hr. to form a 50 nm thick light-emitting layer.

This was placed into a vacuum deposition apparatus and after evacuating a vacuum vessel to $4 \times 10^{-4}$ Ps, calcium as a cathode buffer layer and aluminum as a cathode were each deposited at thicknesses of 10 nm and 110 nm, respectively, whereby organic EL device 1 was prepared.

The thus prepared organic EL device 1 was analyzed with respect to a decrease with time (concentration reduction) of compound 4-11 as a reactive organic compound relating to the invention, as below.

After applying a constant current of 2.5 mA/cm² under a dry nitrogen gas atmosphere at 23° C., the device 1 at the time when a luminance fell by 10% from the initial luminance (90% of the initial luminance) was designated as device 1(M90), and the device at the time when the luminance fell by 30% from the initial luminance (70% of the initial luminance) was designated as device 1(M70). The amount of a residual reactive organic compound was determined as below.

The concentration of compound 4-11 contained in the organic EL device 1, device 1(M90) or device 1(M70) was determined by measurement of the distribution of a vinyl group of the compound 4-11. The distribution of a double bond of a vinyl group was measured according to the following manner.

To secure an area for analysis, the above-described three organic EL device samples each were obliquely cut by using SAICAS Type NN04, produced by DAIPLA WINTES CO., LTD. Cutting was done at 500 power magnification to obtain a 15 µm wide analysis area of a hole transport layer. Subsequently, with respect to the cutting surface, double bonds remained in the hole transport layer were labeled by the bromine addition method. The thus labeled samples were each measured by Quantera SXM, produced by ULVAC-PHI Inc. with respect to elemental composition distribution on the cut surface to determine an elemental composition distribution on the cut surface. From the foregoing elemental analysis results was determined the amount of a residual reactive organic compound. The results thereof are shown in Table 7.

Organic EL Device 2

Organic EL device 2 was prepared and reduction in concentration of a reactive organic compound of the device was analyzed as follows. Thus, organic EL device 2 was prepared in the same manner as the foregoing organic EL device 1. With respect to the thus obtained organic EL device 2, after the amount of a reactive organic compound of device 2(M90) at the time when a luminance fell by 10% from the initial luminance was determined, the device 2(M90) was exposed to UV for 60 sec. to cause the residual organic compound to disappear. Further, a constant current of 2.5 mA/cm² was applied to this device, and the device at the time when a luminance fell by 30% from the initial luminance was designated as device 2(M70) and the amount of a residual organic compound of the device 2(M70) was determined.

Organic EL Device 3

Organic EL device 3 was prepared and reduction in concentration of a reactive organic compound of the device was analyzed as follows. Thus, a substrate, as an anode (NA45, produced by NH Technoglass Co.) obtained by forming a 100 nm thick ITTO (indium oxide) layer on a 100 mm×100 mm×1.1 mm glass substrate was subjected to patterning. Then, the transparent support substrate provided with an ITO transparent electrode was subjected to ultrasonic-washing in isopropyl alcohol, dried in dry nitrogen gas and further subjected to UV ozone washing for 5 min.

A solution in which poly(3,4-ethylenedixythiophene)-polystyrene sulfonate (PEDOT/PSS), Baytron P Al 4083 (produced by Bayer Co.) was coated was diluted to 70% with pure water, was coated onto the foregoing transparent support substrate by a spin coat method at 3000 rpm for 30 sec. and dried at 200° C. for 1 hr. to form a 30 nm thick hole transport layer.

This was placed into a vacuum deposition apparatus and after evacuation a vacuum vessel to $4\times10^{-4}$ Pa, TPD was deposited at a thickness of 30 nm on the hole transport layer to form a second hole transport layer.

Then, tBu-PBD and Ir-1 were co-deposited onto the second hole transport layer so that Ir-1 was doped in an amount of 6% by mass of tBu-PBD, whereby a 50 nm thick light-emitting layer was formed. Further, calcium as a cathode buffer layer and aluminum as a cathode were each deposited at thicknesses of 10 nm and 110 nm, respectively, whereby organic EL device 3.

The device 3 at the time when a luminance fell by 10% or 30% from the initial luminance was designated as device 3(M90) or 3(M70) and the amount of a residual organic compound of the device 3(M90) or 3(M70) was determined similarly to the foregoing organic EL device 1.

Organic EL Device 4

Organic EL device 4 was prepared and reduction in concentration of a reactive organic compound of the device was analyzed. Thus, organic EL device 4 was prepared similarly to the foregoing organic EL device 1, except that the UV exposure time to form the second hole transport layer was changed to 30 sec.

The device 4 at the time when a luminance fell by 10% or 30% from the initial luminance was designated as device 4(M90) or 4(M70) and the amount of a residual organic compound of the device 4(M90) or 4(M70) was determined similarly to the foregoing organic EL device 1.

Organic EL Device 5

Organic EL device 5 was prepared and reduction in concentration of a reactive organic compound of the device was analyzed. Thus, organic EL device 5 was prepared similarly to the foregoing organic EL device 1, except that in photopolymerization/cross-linking in the process of forming the second hole transport layer, UV exposure was conducted for 30 sec., followed by heating at 100° C. for 30 min.

The device 5 at the time when a luminance fell by 10% or 30% from the initial luminance was designated as device 5(M90) or 5(M70) and the amount of a residual organic compound of the device 4(M90) or 4(M70) was determined similarly to the foregoing organic EL device 1.

Lifetime of Organic EL Device 1-5

When driven at a constant current of 2.5 mA/cm², a time necessary to reach a half of a luminance immediately after initiating light emission (initial luminance) was measured, which was designated a half-lifetime ($\tau_{0.5}$) as a measure of lifetime. Measurement was conducted by using a spectroscopic radiation illuminance meter (CS-1000, produced by Konica Minolta Sensing Inc.). Lifetimes shown in Table 7 were represented by relative values, based on the value of organic EL device 4 being 100.

TABLE 7

| Device | Residual Monomer Amount (mol/m³) | | | Lifetime (%) | Remark |
|---|---|---|---|---|---|
| | M90 | M70 | ΔM | | |
| Device 1 | 0.100 | 0.050 | 0.5 | 1200 | Inv. |
| Device 2 | 0.100 | 0.000 | 0.0 | 500 | Inv. |
| Device 3 | 0.000 | 0.000 | 0.0 | 20 | Comp. |
| Device 4 | 0.000 | 0.000 | 0.0 | 100 | Comp. |
| Device 5 | 0.001 | 0.001 | 1.0 | 110 | Comp. |

As shown in Table 7, the organic EL devices of the invention apparently achieved long lifetime and the devices of the invention which exhibited a decrease with time in amount of a reactive organic compound (in other words, development of reconstruction of the layer along with network formation) were long-lived. Specifically, reconstruction of the layer proceeding more slowly with time prevented deterioration and realized a longer-lived device.

Example 14

Organic EL Device 6

Organic EL device 6 was prepared and reduction in concentration of a reactive organic compound of the device was analyzed as follows. Thus, a substrate, as an anode (NA45, produced by NH Technoglass Co.) obtained by forming a 100 nm thick ITTO (indium oxide) layer on a 100 mm×100 mm×1.1 mm glass substrate was subjected to patterning. Then, the transparent support substrate provided with an ITO transparent electrode was subjected to ultrasonic-washing in isopropyl alcohol, dried in dry nitrogen gas and further subjected to UV ozone washing for 5 min.

A solution in which poly(3,4-ethylenedixythiophene)-polystyrene sulfonate (PEDOT/PSS), Baytron P Al 4083 (produced by Bayer Co.) was coated was diluted to 70% with pure water, was coated onto the foregoing transparent support substrate by a spin coat method at 3000 rpm for 30 sec. and dried at 200° C. for 1 hr. to form a 30 nm thick hole transport layer.

The thus prepared substrate was moved into a nitrogen atmosphere and on the hole transport layer, a solution of 20 mg of a reactive organic compound 4-11 dissolved in 5 ml toluene was spin-coated at 2000 rpm for 30 sec. to form a layer and then exposed to UV (100 WW, UVA) for 15 sec. to perform photopolymerization/cross-linking so that unreacted compound 4-11 remained, whereby a 30 nm thick second hole transport layer was formed.

Further thereon, a solution of compound 3-1 dissolved in 3 ml of tetrahydrofuran was spin-coated and exposed to UV (100 W, UVA) to form a 25 nm thick electron transport layer.

This was placed into a vacuum deposition apparatus and after evacuating a vacuum vessel to $4\times10^{-4}$ Ps, calcium as a cathode buffer layer and aluminum as a cathode were each deposited at thicknesses of 1.0 nm and 110 nm, respectively, whereby organic EL device 6 was prepared. The reactive organic compound concentration in the layer was determined similarly to Example 13.

Organic EL Element 7

Organic EL device 7 was prepared and reduction in concentration of a reactive organic compound of the device was analyzed as follows. Thus, Organic EL device 7 was prepared similarly to the foregoing organic EL device 7, except that in the formation of the second hole transport layer, light-emitting layer and electron transport layer, a UV exposure time was changed to 60 sec. The reactive organic compound concentration in the layer was determined similarly to Example 13.

Similarly to Example 13, the thus obtained organic EL devices 6 and 7 were evaluated with respect to luminescence lifetime. The results thereof are shown in Table 8

TABLE 8

| Device | Second Hole Transport Layer Residual Monomer Amount (mol/m³) | | | Luminescent Layer Residual Monomer Amount (mol/m³) | | | Electron Transport Layer Residual Monomer Amount (mol/m³) | | | Lifetime | |
|---|---|---|---|---|---|---|---|---|---|---|---|
| | M90 | M70 | ΔM | M90 | M70 | ΔM | M90 | M70 | ΔM | | |
| Device 6 | 0.100 | 0.050 | 0.5 | 0.106 | 0.067 | 0.6 | 0.081 | 0.032 | 0.4 | 800 | Inv. |
| Device 7 | 0.000 | 0.000 | 0.0 | 0.000 | 0.000 | 0.0 | 0.000 | 0.000 | 0.0 | 100 | Comp. |

As is apparent from Table 8, it was proved that even in the case of being multi-layered, tendencies similar to Example 13 and the devices which exhibited a decrease with time in an amount of a reactive organic compound (in other words, development of reconstruction of the layer along with network formation) resulted in enhanced lifetime.

Example 15

Preparation of Organic EL Full-Color Display Device

FIGS. 1(a) through 1(e) illustrate constitution of an organic EL display device. A substrate as an anode (NA45, produced by NH Technoglass Co.) obtained by forming a 100 nm thick ITTO film (102) on a glass substrate (101), as shown in FIG. 1(a), was subjected to patterning at a pitch of 100 μm. A polyimide barrier 103 (width: 20 μm, thickness: 2.0 μm) was formed between ITO transparent electrodes on the glass substrate by means of photolithography. A composition for a hole injection layer, as described below was injected between these polyimide barriers on the ITO electrode by using an ink jet head (MJ 800C, produced by Seiko Epson Corp.), exposed to ultraviolet rays for 30 sec. and dried at 60° C. for 10 min. to form a hole injection layer 104, as shown in FIG. 1(c).

Further, a blue-light-emitting layer composition, a green-light-emitting layer composition and a red-light-emitting layer composition, as described below were each ejected onto the hole injection layer, similarly by using an ink jet head, exposed to ultraviolet rays for 30 sec. and dried at 60° C. for 10 min. to form light-emitting layers (105B, 105G, 105R), as shown in FIG. 1(d). Finally, Aluminum as a cathode (106) was vacuum-deposited to cover the light-emitting layers, whereby an organic EL device was prepared, as shown in FIG. 1(e).

It was proved that the thus prepared organic EL device emitted blue, green and red lights by applying a voltage to the individual electrodes and was usable as a full-color display device.

| Hole injection layer composition | |
|---|---|
| Compound 4-11 | 20 parts by mass |
| Cyclohexylbenzene | 50 parts by mass |
| Isopropyl biphenyl | 50 parts by mass |
| Blue-emitting layer composition | |
| Compound 1-2 | 0.7 parts by mass |
| Compound 2-9 | 0.04 parts by mass |
| Cyclohexylbenzene | 50 parts by mass |
| Isopropyl biphenyl | 50 parts by mass |
| Green-emitting layer composition | |
| Compound 1-2 | 0.7 parts by mass |
| Compound 2-2 | 0.04 parts by mass |
| Cyclohexylbenzene | 50 parts by mass |
| Isopropyl biphenyl | 50 parts by mass |

-continued

| Red-emitting layer composition | |
|---|---|
| Compound 1-2 | 0.7 parts by mass |
| Compound 2-5 | 0.04 parts by mass |
| Cyclohexylbenzene | 50 parts by mass |
| Isopropyl biphenyl | 50 parts by mass |

Example 16

Preparation of Organic EL White-Lighting Device

A white-emitting organic EL device 6 W (white) was prepared similarly to the organic EL device of Example 13, except that compound 2-2 used for the luminescence composition was changed to a mixture of compounds 2-2, 2-5 and 2-9. To evaluate the thus prepared organic EL device 6W, the non-light-emitting surface of the device was covered with a glass case to prepare a lighting device. The lighting device was usable as a flat panel lighting device emitting white light with enhanced light-emitting efficiency and long-lived emission.

What is claimed is:

1. An organic electroluminescence device comprising on a support substrate an anode and a cathode, and one or more organic layers between the anode and the cathode and at least one organic layer containing a reactive organic compound, wherein when an electric current is applied to device at a current density of from 0.01 mA/cm² to 10000 mA/cm², a concentration of the reactive organic compound is reduced from a concentration before application of the electric current and when an emission luminance is reduced to 90% of an initial luminance by application of the electric current, a concentration (M90) of the reactive organic compound is within a range of 0.1 mol/cm³ to 10 mol/m³.

2. The organic electroluminescence device as claimed in 1, wherein the current density is from 0.01 mA/cm² to 1000 mA/cm².

3. The organic electroluminescence device as claimed in claim 1, wherein the reactive organic compound is a polymerizable monomer.

4. The organic electroluminescence device as claimed in claim 1, wherein the reactive substituents each have any one of partial structures represented by the following formulas:

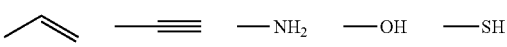

-continued

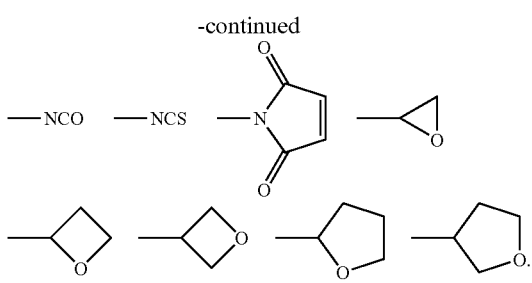

5. The organic electroluminescence device as claimed in claim 1, wherein when an emission luminance is reduced to 90% of an initial emission luminance by application of the electric current, the concentration of the reactive organic compound in the organic layer is reduced from a concentration before the application of an electric current.

6. The organic electroluminescence device as claimed in claim 1, wherein a ratio of a concentration (M70) of the reactive organic compound when an emission luminance is reduced to 70% of an initial luminance to a concentration (M90) of the reactive organic compound when a luminance is lowered to 90% of an initial luminance, ΔM (M70/M90) meets the following requirement (1):

$$0.1 \leq \Delta M < 1.0. \quad \text{requirement (1)}$$

7. The organic electroluminescence device as claimed in claim 1, wherein at least one of the organic layers satisfies the following expression (2):

$$1.04 < [Tg(50\%)/Tg(\text{initial})] < 1.20 \quad \text{expression (2)}$$

wherein Tg(50%) is a glass transition point when an emission luminance is reduced to 50% of an initial emission luminance and Tg(initial) is a glass transition point before initiating the application of an electric current.

8. The organic electroluminescence device as claimed in claim 7, wherein the Tg(90%) and the Tg(50%) meet the following expression (3):

$$1.00 < [Tg(50\%)/Tg(90\%)] < 1.05. \quad \text{expression (3)}$$

9. A lighting device provided with an organic electroluminescence device as claimed in claim 1.

10. A display device provided with an organic electroluminescence device as claimed in claim 1.

11. An organic electroluminescence device comprising on a support substrate an anode and a cathode, and one or more organic layers between the anode and the cathode and at least one organic layer containing a reactive organic compound, wherein when an electric current is applied to device at a current density of from 0.01 mA/cm² to 10000 mA/cm², a concentration of the reactive organic compound is reduced from a concentration before application of the electric current and at least one of the organic layers satisfies the following expression (1):

$$1.03 \leq [Tg(90\%)/Tg(\text{initial})] \leq 1.20 \quad \text{expression (1)}$$

wherein Tg(90%) is a glass transition point when an emission luminance is reduced to 90% of an initial emission luminance and Tg(initial) is a glass transition point before initiating the application of an electric current.

12. The organic electroluminescence device as claimed in 11, wherein the current density is from 0.01 mA/cm² to 1000 mA/cm².

13. The organic electroluminescence device as claimed in claim 11, wherein the reactive organic compound is a polymerizable monomer.

14. The organic electroluminescence device as claimed in claim 11, wherein the reactive substituents each have any one of partial structures represented by the following formulas:

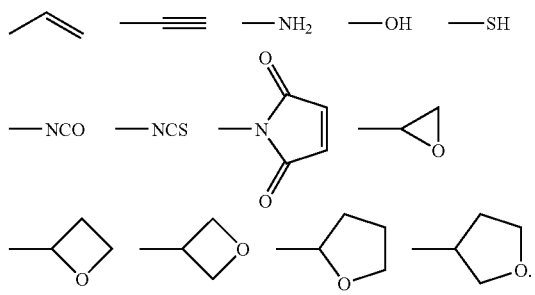

15. The organic electroluminescence device as claimed in claim 11, wherein when an emission luminance is reduced to 90% of an initial emission luminance by application of the electric current, the concentration of the reactive organic compound in the organic layer is reduced from a concentration before the application of an electric current.

16. The organic electroluminescence device as claimed in claim 11, wherein a ratio of a concentration (M70) of the reactive organic compound when an emission luminance is reduced to 70% of an initial luminance to a concentration (M90) of the reactive organic compound when a luminance is lowered to 90% of an initial luminance, ΔM (M70/M90) meets the following requirement (1):

$$0.1 \leq \Delta M < 1.0. \quad \text{requirement (1)}$$

17. The organic electroluminescence device as claimed in claim 11, wherein at least one of the organic layers satisfies the following expression (2):

$$1.04 \leq [Tg(90\%)/Tg(\text{initial})] \leq 1.20 \quad \text{expression (2)}$$

wherein Tg(50%) is a glass transition point when an emission luminance is reduced to 50% of an initial emission luminance and Tg(initial) is a glass transition point before initiating the application of an electric current.

18. The organic electroluminescence device as claimed in claim 17, wherein the Tg(90%) and the Tg(50%) meet the following expression (3):

$$1.00 < [Tg(50\%)/Tg(90\%)] \leq 1.05. \quad \text{expression (3)}$$

19. A lighting device provided with an organic electroluminescence device as claimed in claim 16.

20. A display device provided with an organic electroluminescence device as claimed in claim 11.

* * * * *